(12) United States Patent
Fukuda et al.

(10) Patent No.: US 11,603,466 B2
(45) Date of Patent: Mar. 14, 2023

(54) EPOXY RESIN COMPOSITION

(71) Applicant: SUMITOMO SEIKA CHEMICALS CO., LTD., Hyogo (JP)

(72) Inventors: Noriaki Fukuda, Kako-gun (JP); Ryota Harisaki, Kako-gun (JP); Katsumasa Yamamoto, Kako-gun (JP)

(73) Assignee: SUMITOMO SEIKA CHEMICALS CO.. LTD., Hyogo (JP)

( * ) Notice: Subject to any disclaimer, the term of this patent is extended or adjusted under 35 U.S.C. 154(b) by 142 days.

(21) Appl. No.: 16/476,695

(22) PCT Filed: Jan. 9, 2018

(86) PCT No.: PCT/JP2018/000202
§ 371 (c)(1),
(2) Date: Jul. 9, 2019

(87) PCT Pub. No.: WO2018/131570
PCT Pub. Date: Jul. 19, 2018

(65) Prior Publication Data
US 2020/0385565 A1  Dec. 10, 2020

(30) Foreign Application Priority Data
Jan. 10, 2017  (JP) .............................. JP2017-002215

(51) Int. Cl.
| | | |
|---|---|---|
| C08L 63/00 | (2006.01) | |
| C08G 59/30 | (2006.01) | |
| C08G 59/32 | (2006.01) | |
| C08G 59/42 | (2006.01) | |
| C08G 59/38 | (2006.01) | |
| C08G 59/68 | (2006.01) | |
| C09D 163/00 | (2006.01) | |
| C09J 163/00 | (2006.01) | |
| H01L 23/29 | (2006.01) | |
| C08G 59/24 | (2006.01) | |
| C08G 59/62 | (2006.01) | |
| C09D 7/65 | (2018.01) | |
| C09J 11/08 | (2006.01) | |
| C09K 3/10 | (2006.01) | |
| H01L 23/31 | (2006.01) | |

(52) U.S. Cl.
CPC ............ *C08L 63/00* (2013.01); *C08G 59/306* (2013.01); *C08G 59/3281* (2013.01); *C08G 59/38* (2013.01); *C08G 59/4215* (2013.01); *C08G 59/686* (2013.01)

(58) Field of Classification Search
None
See application file for complete search history.

(56) References Cited

U.S. PATENT DOCUMENTS

| | | | | |
|---|---|---|---|---|
| 3,445,483 A | * | 5/1969 | Chaffee ................ | C08G 59/306 549/215 |
| 4,801,645 A | | 1/1989 | Nishio et al. | |
| 4,954,140 A | * | 9/1990 | Kawashima ............ | B24D 3/28 51/293 |
| 5,093,399 A | * | 3/1992 | Brook .................. | C09D 163/00 524/531 |
| 5,567,744 A | * | 10/1996 | Nagata ..................... | C08J 5/124 428/407 |
| 5,639,413 A | | 6/1997 | Crivello | |
| 5,863,970 A | | 1/1999 | Ghoshal et al. | |
| 6,194,490 B1 | | 2/2001 | Roth et al. | |
| 6,779,656 B2 | | 8/2004 | Klettke et al. | |
| 6,908,953 B2 | | 6/2005 | Weinmann et al. | |
| 7,235,602 B2 | | 6/2007 | Klettke et al. | |
| 7,368,524 B2 | | 5/2008 | Eckert et al. | |
| 7,740,482 B2 | | 6/2010 | Frances et al. | |
| 7,799,846 B2 | | 9/2010 | Eckert et al. | |
| 7,893,130 B2 | | 2/2011 | Frances | |
| 8,715,905 B2 | | 5/2014 | Tagami et al. | |
| 11,166,383 B2 | | 11/2021 | Yoneda et al. | |
| 2003/0035899 A1 | | 2/2003 | Klettke et al. | |
| 2004/0122186 A1 | | 6/2004 | Herr et al. | |
| 2004/0186202 A1 | | 9/2004 | Klettke et al. | |
| 2007/0093614 A1 | | 4/2007 | Uchida et al. | |
| 2008/0071035 A1 | | 3/2008 | Delsman et al. | |
| 2010/0035003 A1 | | 2/2010 | Frances et al. | |
| 2010/0273937 A1 | | 10/2010 | Tajima et al. | |
| 2011/0076465 A1 | | 3/2011 | Takeda et al. | |
| 2011/0120761 A1 | | 5/2011 | Kawai | |
| 2011/0311788 A1 | | 12/2011 | Tagami et al. | |
| 2013/0320264 A1 | | 12/2013 | Yoshida et al. | |
| 2015/0034980 A1 | | 2/2015 | Windisch | |

(Continued)

FOREIGN PATENT DOCUMENTS

| | | |
|---|---|---|
| EP | 1 679 328 A1 | 7/2006 |
| GB | 1123960 A | 8/1968 |

(Continued)

OTHER PUBLICATIONS

U.S. Appl. No. 16/476,681, filed Jul. 9, 2019, Noriaki Fukuda.
U.S. Appl. No. 16/476,679, filed Jul. 9, 2019, Noriaki Fukuda.
U.S. Appl. No. 16/476,714, filed Jul. 9, 2019, Ryota Harisaki.
U.S. Appl. No. 16/476,721, filed Jul. 9, 2019, Noriaki Fukuda.
Non-Final Office Action dated Sep. 16, 2020 issued in U.S. Appl. No. 16/476,714.
Extended European Search Report dated Jun. 23, 2020 by the European Patent Office in European application No. 18738684.2.
Extended European Search Report dated Jun. 9, 2020 by the European Patent Office in European application No. 18738880.6.

(Continued)

*Primary Examiner* — Randy P Gulakowski
*Assistant Examiner* — Ha S Nguyen
(74) *Attorney, Agent, or Firm* — Sughrue Mion, PLLC

(57) ABSTRACT

Provided is an epoxy resin composition that can achieve excellent low dielectric characteristics and high adhesive strength to metal. Specifically, provided is an epoxy resin composition comprising organic fine particles and an epoxy resin having a specific structure.

7 Claims, No Drawings

(56) References Cited

U.S. PATENT DOCUMENTS

| | | |
|---|---|---|
| 2015/0368397 A1 | 12/2015 | Suwa et al. |
| 2016/0237202 A1 | 8/2016 | Shiobara et al. |
| 2016/0255718 A1 | 9/2016 | Xin et al. |
| 2016/0355711 A1 * | 12/2016 | Okamoto ............... C09J 163/00 |
| 2016/0357105 A1 | 12/2016 | Asai et al. |
| 2017/0259544 A1 | 9/2017 | Okimura et al. |
| 2017/0297302 A1 | 10/2017 | Okimura et al. |
| 2018/0242448 A1 | 8/2018 | Yoshikawa et al. |
| 2018/0327593 A1 | 11/2018 | Kasahara et al. |
| 2018/0327595 A1 | 11/2018 | Fukuda et al. |
| 2018/0334594 A1 | 11/2018 | Nishijima et al. |
| 2019/0070837 A1 | 3/2019 | Ichioka et al. |
| 2019/0119434 A1 | 4/2019 | Fukuda et al. |
| 2021/0009865 A1 | 1/2021 | Okimura et al. |

FOREIGN PATENT DOCUMENTS

| | | | |
|---|---|---|---|
| JP | 5-9270 | A | 1/1993 |
| JP | H05-020447 | B2 | 3/1993 |
| JP | 6-192393 | A | 7/1994 |
| JP | 7-157540 | A | 6/1995 |
| JP | 8-325355 | A | 12/1996 |
| JP | 9-48839 | A | 2/1997 |
| JP | 10-335768 | A | 12/1998 |
| JP | 2001-240654 | A | 9/2001 |
| JP | 2001-240838 | A | 9/2001 |
| JP | 2001240838 | A * | 9/2001 |
| JP | 2001288337 | A * | 10/2001 |
| JP | 2003-2953 | A | 1/2003 |
| JP | 2003-160644 | A | 6/2003 |
| JP | 2003-519705 | A | 6/2003 |
| JP | 2003-321482 | A | 11/2003 |
| JP | 2004-027159 | A | 1/2004 |
| JP | 2004-231728 | A | 8/2004 |
| JP | 2004-527602 | A | 9/2004 |
| JP | 2004-277460 | A | 10/2004 |
| JP | 2005-187800 | A | 7/2005 |
| JP | 2005-272492 | A | 10/2005 |
| JP | 2006-176762 | A | 7/2006 |
| JP | 2007-254709 | A | 10/2007 |
| JP | 2008-505945 | A | 2/2008 |
| JP | 2008-506697 | A | 3/2008 |
| JP | 2009-227992 | A | 10/2009 |
| JP | 2009-544785 | A | 12/2009 |
| JP | 2010-215858 | A | 9/2010 |
| JP | 2010-254814 | A | 11/2010 |
| JP | 2011-94115 | A | 5/2011 |
| JP | 2012-1668 | A | 1/2012 |
| JP | 4849654 | B2 | 1/2012 |
| JP | 2012-162585 | A | 8/2012 |
| JP | 2013-007001 | A | 1/2013 |
| JP | 5118469 | B2 | 1/2013 |
| JP | 2013-166941 | A | 8/2013 |
| JP | 2014-177530 | A | 9/2014 |
| JP | 2016-031342 | A | 3/2016 |
| JP | 2016-069548 | A | 5/2016 |
| JP | 2016-079354 | A | 5/2016 |
| JP | 2016-117904 | A | 6/2016 |
| JP | 2016-135859 | A | 7/2016 |
| JP | 2017-3707 | A | 1/2017 |
| JP | 2017-019983 | A | 1/2017 |
| JP | 2017-031301 | A | 2/2017 |
| JP | 6215711 | B2 | 10/2017 |
| JP | 2018-135506 | A | 8/2018 |
| JP | 6426290 | B2 | 11/2018 |
| JP | 2019-048906 | A | 3/2019 |
| WO | 2004/104097 | A1 | 12/2004 |
| WO | 2006/005369 | A1 | 1/2006 |
| WO | 2006/019797 | A1 | 2/2006 |
| WO | 2012/042796 | A1 | 4/2012 |
| WO | 2012/111765 | A1 | 8/2012 |
| WO | 2013/140601 | A1 | 9/2013 |
| WO | 2014/046095 | A1 | 3/2014 |
| WO | 2014/147903 | A1 | 9/2014 |
| WO | 2015/041325 | A1 | 3/2015 |
| WO | 2015/093281 | A1 | 6/2015 |
| WO | WO-2015093281 | A1 * | 6/2015 ............ C09J 163/00 |
| WO | 2016/017473 | A1 | 2/2016 |
| WO | 2016/047289 | A1 | 3/2016 |
| WO | 2016/185956 | A1 | 11/2016 |
| WO | 2017/010401 | A1 | 1/2017 |
| WO | 2017/086368 | A1 | 5/2017 |
| WO | 2018/131563 | A1 | 7/2018 |
| WO | 2018/131564 | A1 | 7/2018 |
| WO | 2018/131567 | A1 | 7/2018 |
| WO | 2018/131569 | A1 | 7/2018 |
| WO | 2018/131570 | A1 | 7/2018 |
| WO | 2018/131571 | A1 | 7/2018 |
| WO | 2018/181719 | A1 | 10/2018 |
| WO | 2019/026822 | A1 | 2/2019 |
| WO | 2019/172109 | A1 | 9/2019 |
| WO | 2020/262061 | A1 | 12/2020 |
| WO | 2021/145240 | A1 | 7/2021 |
| WO | 2021/145241 | A1 | 7/2021 |

OTHER PUBLICATIONS

U.S. Appl. No. 15/743,189, filed Jan. 9, 2018 Fukuda et al, Pending; published as US 2019/0119434.
U.S. Appl. No. 15/776,501, filed May 16, 2018 Fukuda et al, Pending; published as US 2018/0327595.
U.S. Appl. No. 16/476,679, filed Jul. 9, 2019 Fukuda et al, Pending; not yet published.
U.S. Appl. No. 16/476,681, filed Jul. 9, 2019 Fukuda et al, Pending; not yet published.
U.S. Appl. No. 16/476,714, filed Jul. 9, 2019 Harisaki et al, Pending; not yet published.
U.S. Appl. No. 16/476,721, filed Jul. 9, 2019 Fukuda et al, Pending; not yet published.
Non-Final Office Action dated Dec. 10, 2020 issued in U.S. Appl. No. 16/882,016.
Non-Final Office Action dated Jan. 1, 2021 issued in U.S. Appl. No. 16/476,681.
Extended European Search Report dated Jan. 24, 2019 for EP Patent Application No. 16824381.4 relating to U.S. Appl. Nos. 15/743,189 and 15/776,501.
International Search Report for PCT/JP2018/013257 dated Jun. 26, 2018 [PCT/ISA/210] relating to U.S. Appl. Nos. 15/743,189 and 15/776,501.
Office Action dated Feb. 5, 2021 in U.S. Appl. No. 16/476,721.
"Poly (2,6-dimethyl-1,4-phenylene oxide) analytical standard", Website Sigma Aldrich, PPE, article 181803, Apr. 23, 2021, pp. 1-2 (2 pages total).
Communication dated May 7, 2021 issued by the European Patent Office in EP application No. 18738683.4, corresponding to U.S. Appl. No. 16/476,721.
Office Action dated Apr. 2, 2021 from the US Patent & Trademark Office in U.S. Appl. No. 16/476,679.
U.S. Appl. No. 17/597,063, which corresponds to WO 2020/262061.
Office Action dated Mar. 14, 2022 by Korean Patent Office in Korean Application No. 10-2019-7021257.
Communication dated Mar. 21, 2019, issued by the U.S. Patent and Trademark Office in U.S. Appl. No. 15/776,501.
Extended European Search Report dated Jan. 24, 2019 for EP Patent Application No. 16824381.4 relating to U.S. Appl. Nos. 15/743,189 and U.S. Appl. No. 15/776,501.
J. V. Crivello et al., "The Synthesis and Cationic Polymerization of Multifunctional Silicon-Containing Epoxy Monomers and Oligomers", Journal of Polymer Science, Part A: Polymer Chemistry, 1994, pp. 683-697, vol. 32, No. 4.
Tomikazu Ueno, "Elastomer modification of epoxy resin" (modification effect of particulate crosslinked elastomer), 23rd Open Technical Lecture, Japan Society of Epoxy Resin Technology, 1999, 12 pages.
Xin Yang et al., "Synthesis and Properties of Silphenylene-containing Epoxy Resins with High UV-stability", Journal of Macromolecular Science, Part A: Pure and Applied Chemistry, 2011, pp. 692-700, vol. 48, No. 9.

(56) References Cited

OTHER PUBLICATIONS

International Search Report for PCT/JP2018/000200 dated Apr. 17, 2018 [PCT/ISA/210] corresponding to U.S. Appl. No. 16/476,679.
International Search Report for PCT/JP2018/000203 dated Apr. 17, 2018 [PCT/ISA/210] corresponding to U.S. Appl. No. 16/476,681.
International Search Report for PCT/JP2018/000198 dated Apr. 17, 2018 [PCT/ISA/210] corresponding to U.S. Appl. No. 16/476,714.
International Search Report for PCT/JP2018/000202 dated Apr. 17, 2018 [PCT/ISA/210].
International Search Report for PCT/JP2018/000192 dated Apr. 17, 2018 [PCT/ISA/210] corresponding to U.S. Appl. No. 16/476,721.
International Search Report of PCT/JP2016/084031 dated Jan. 31, 2017 [PCT/ISA/210] corresponding to U.S. Appl. No. 15/776,501.
International Search Report for PCT/JP2018/013257 dated Jun. 26, 2018 [PCT/ISA/210] relating to U.S. Appl. Nos. 15/743,189 and U.S. Appl. No. 15/776,501.
International Search Report for PCT/JP2016/070158 dated Sep. 20, 2016 [PCT/ISA/210] corresponding to U.S. Appl. No. 15/743,189.

\* cited by examiner

EPOXY RESIN COMPOSITION

TECHNICAL FIELD

The present invention relates to an epoxy resin composition, a method for producing the same, and use of the composition.

BACKGROUND ART

Transmission rate and frequency have recently been increased along with an increase in the performance of communication devices. Materials used in printed circuit boards and semiconductor sealing materials are strongly required to have a lower dielectric constant in the high-frequency region. In this field, thermosetting resins, such as epoxy resins, are widely used as substrate materials or sealing materials. For example, PTL 1 discloses that a composition comprising a dicyclopentadiene-type epoxy resin and a curing agent has low dielectric characteristics.

Moreover, further modification of epoxy resins is required in order to satisfy both the requirements of reducing the weight of substrate materials and increasing frequency. For example, in NPL 1, elastomer particles, such as NBR (acrylonitrile/butadiene rubber), are blended as a modifying component, and the characteristics of a cured product of an epoxy resin composition are improved.

CITATION LIST

Patent Literature

PTL 1: JP2001-240654A
PTL 2: GB1123960B
PTL 3: WO2015/093281

Non-Patent Literature

NPL 1: Tomikazu UENO: "Elastomer modification of epoxy resin" (modification effect of particulate crosslinked elastomer), 23rd Open Technical Lecture, Japan Society of Epoxy Resin Technology, pp. 79-88, 1999

SUMMARY OF INVENTION

Technical Problem

In the epoxy resin composition of PTL 1, the dielectric characteristics of a cured product of the epoxy resin composition are improved using a dicyclopentadiene-type epoxy resin, but are still not sufficient. In addition, the epoxy resin composition disclosed in NPL 1 has a problem that, while the mechanical strength is improved, the electrical characteristics of acrylonitrile contained in NBR are poor, and the dielectric characteristics of the composition and the cured product thereof are deteriorated.

An object of the present invention is to provide an epoxy resin composition that has excellent electrical characteristics (particularly low dielectric tangent) when cured, and that can achieve high adhesive strength to metal.

Solution to Problem

As a result of extensive research to solve the above problem, the present inventors found that an epoxy resin composition comprising organic fine particles and a specific epoxy resin containing a silicon atom has excellent low dielectric characteristics. The present invention has been completed upon further studies based on this finding.

The present invention includes the main subjects shown in the following items.

Item 1. An epoxy resin composition comprising an epoxy resin and organic fine particles, the epoxy resin being represented by the formula (1):

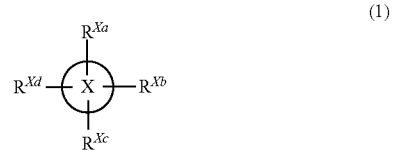

wherein X ring is a saturated hydrocarbon ring or an unsaturated hydrocarbon ring, or rings having a structure in which 2 to 6 saturated hydrocarbon rings and/or unsaturated hydrocarbon rings are condensed, or in which 2 saturated hydrocarbon rings and/or unsaturated hydrocarbon rings are connected;

$R^{Xa}$, $R^{Xb}$, $R^{Xc}$, and $R^{Xd}$ are the same or different, and each is a hydrogen atom, a lower alkyl group, a lower alkoxy group, a lower alkenyl group, a halogen atom, or a group represented by the formula (3):

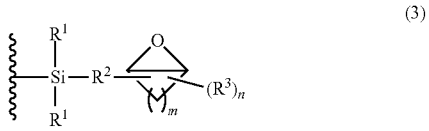

wherein $R^1$ is the same or different, and is a $C_{1-18}$ alkyl group, a $C_{2-9}$ alkenyl group, a cycloalkyl group, an aryl group, or an aralkyl group, wherein one or more carbon atoms of these groups may be replaced by at least one atom selected from the group consisting of an oxygen atom and a nitrogen atom;

$R^2$ is a $C_{1-18}$ alkylene group, wherein one or more carbon atoms of this group other than a carbon atom directly bonded to a silicon atom may be replaced by at least one atom selected from the group consisting of an oxygen atom and a nitrogen atom;

$R^3$ is the same or different, and is a $C_{1-18}$ alkyl group, a $C_{2-9}$ alkenyl group, a cycloalkyl group, an aryl group, or an aralkyl group, wherein one or more carbon atoms of these groups may be replaced by at least one atom selected from the group consisting of an oxygen atom and a nitrogen atom;

m is an integer of 0 to 6; and n is an integer of 0 to 3;

provided that at least one of $R^{Xa}$, $R^{Xb}$, $R^{Xc}$, and $R^{Xd}$ is a group represented by the formula (3); and one or more hydrogen atoms bonded to one or more carbon atoms that constitute the hydrocarbon ring constituting the X ring, and that are not bonded to $R^{Xa}$, $R^{Xb}$, $R^{Xc}$, or $R^{Xd}$, may be replaced by a lower alkyl group, a lower alkoxy group, a lower alkenyl group, or a halogen atom.

Item 2. The epoxy resin composition according to Item 1, wherein the rings having a structure in which 2 saturated hydrocarbon rings and/or unsaturated hydrocarbon rings are connected are rings represented by the formula (2):

(2)

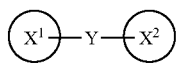

wherein $X^1$ ring and $X^2$ ring are the same or different, and each is a saturated hydrocarbon ring or an unsaturated hydrocarbon ring; and Y is a bond, a $C_{1-6}$ alkylene group that may be substituted with a $C_{1-4}$ alkyl group, an oxygen atom (—O—), a sulfur atom (—S—), —SO—, or —SO$_2$—.

Item 3. The epoxy resin composition according to Item 1 or 2, wherein the saturated hydrocarbon ring is a $C_{4-8}$ saturated hydrocarbon ring, and the unsaturated hydrocarbon ring is a $C_{4-8}$ unsaturated hydrocarbon ring.

Item 4. The epoxy resin composition according to Item 1, wherein the composition comprises organic fine particles and at least one epoxy resin selected from the group consisting of: an epoxy resin represented by the formula (1-iia):

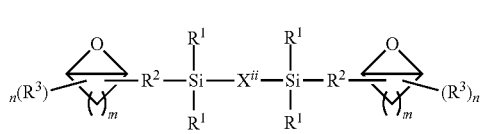

(1-iia)

wherein $X^{ii}$ is a divalent group obtained by removing two hydrogen atoms from a saturated hydrocarbon ring or an unsaturated hydrocarbon ring, or from rings having a structure in which 2 to 6 saturated hydrocarbon rings and/or unsaturated hydrocarbon rings are condensed; or a divalent group represented by the formula (2$^g$-iia)

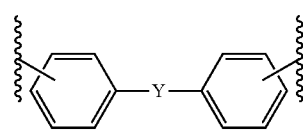

(2$^g$-iia)

wherein Y is a bond, a $C_{1-6}$ alkylene group that may be substituted with a $C_{1-4}$ alkyl group, an oxygen atom (—O—), a sulfur atom (—S—), —SO—, or —SO$_2$—;

$R^1$ is the same or different, and is a $C_{1-18}$ alkyl group, a $C_{2-9}$ alkenyl group, a cycloalkyl group, an aryl group, or an aralkyl group, wherein one or more carbon atoms of these groups may be replaced by at least one atom selected from the group consisting of an oxygen atom and a nitrogen atom;

$R^2$ is the same or different, and is a $C_{1-18}$ alkylene group, wherein one or more carbon atoms of this group other than a carbon atom directly bonded to a silicon atom may be replaced by at least one atom selected from the group consisting of an oxygen atom and a nitrogen atom;

$R^3$ is the same or different, and is a $C_{1-18}$ alkyl group, a $C_{2-9}$ alkenyl group, a cycloalkyl group, an aryl group, or an aralkyl group, wherein one or more carbon atoms of these groups may be replaced by at least one atom selected from the group consisting of an oxygen atom and a nitrogen atom;

m is an integer of 0 to 6; and n is an integer of 0 to 3; and an epoxy resin represented by the formula (1-iiia):

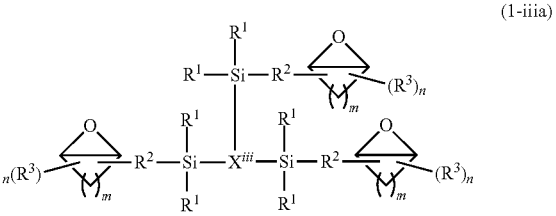

(1-iiia)

wherein $X^{iii}$ is a trivalent group obtained by removing three hydrogen atoms from a saturated hydrocarbon ring or an unsaturated hydrocarbon ring, or from rings having a structure in which 2 to 6 saturated hydrocarbon rings and/or unsaturated hydrocarbon rings are condensed; or a trivalent group represented by the formula (2$^g$-iiia):

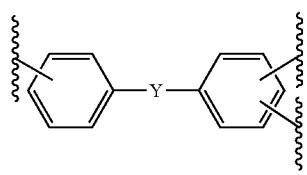

(2$^g$-iiia)

wherein Y is as defined above; and $R^1$, $R^2$, $R^3$, m, and n are as defined above.

Item 5. The epoxy resin composition according to any one of Items 1 to 4, wherein the organic fine particles have a volume average particle diameter of 50 μm or less.

Item 6. The epoxy resin composition according to any one of Items 1 to 5, wherein the organic fine particles are polyolefin resin fine particles.

Item 7. The epoxy resin composition according to any one of Items 1 to 6, wherein the organic fine particles have a spherical shape.

Item 8. The epoxy resin composition according to any one of Items 1 to 7, wherein the organic fine particles are contained in an amount of 20 to 400 parts by mass based on 100 parts by mass of the epoxy resin represented by the formula (1).

Item 9. A cured product of the epoxy resin composition according to any one of Items 1 to 8.

Item 10. A semiconductor sealing material, a liquid sealing material, a potting material, a sealing material, an interlayer insulation film, an adhesive layer, a coverlay film, an electromagnetic shielding film, a printed circuit board material, or a composite material, each of which uses the epoxy resin composition according to any one of Items 1 to 8 or the cured product according to Item 9.

Item 11. The epoxy resin composition according to any one of Items 1 to 8 or the cured product according to Item 9 for use in a semiconductor sealing material, a liquid sealing material, a potting material, a sealing material, an interlayer insulation film, an adhesive layer, a coverlay film, an electromagnetic shielding film, a printed circuit board material, or a composite material.

Item 12. Use of the epoxy resin composition according to any one of Items 1 to 8 or the cured product according to Item 9 for producing a semiconductor sealing material, a liquid sealing material, a potting material, a sealing material, an interlayer insulation film, an adhesive layer, a coverlay film, an electromagnetic shielding film, a printed circuit board material, or a composite material.

Advantageous Effects of Invention

Because the epoxy resin composition of the present invention comprises an epoxy resin represented by the above formula (1) and organic fine particles, a cured product thereof maintains good electric characteristics and has high adhesive strength to metal. Therefore, the epoxy resin composition of the present invention can be suitably used for various applications, such as semiconductor sealing materials, liquid sealing materials, potting materials, sealing materials, printed circuit board materials, interlayer insulation films, adhesive layers, coverlay films, electromagnetic shielding films, and composite materials.

DESCRIPTION OF EMBODIMENTS

Embodiments of the present invention are described in more detail below.

The epoxy resin composition contained in the present invention comprises an epoxy resin and organic fine particles, the epoxy resin being represented by the formula (1):

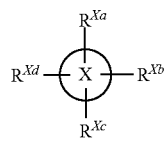

In the formula (1), $R^{Xa}$, $R^{Xb}$, $R^{Xc}$, and $R^{Xd}$ are the same or different, and each is a hydrogen atom, a lower alkyl group, a lower alkoxy group, a lower alkenyl group, a halogen atom, or a group represented by the formula (3):

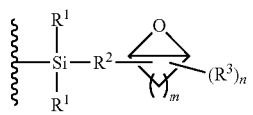

(hereinafter also referred to as the "group of the formula (3)"). Hereinafter, a lower alkyl group, a lower alkoxy group, and a lower alkenyl group are also collectively referred to as "lower carbon substituents." In the present invention, among the lower carbon substituents, a lower alkyl group or a lower alkoxy group is more preferable.

However, at least one of $R^{Xa}$, $R^{Xb}$, $R^{Xc}$, and $R^{Xd}$ is a group of the formula (3). In other words, three of $R^{Xa}$, $R^{Xb}$, $R^{Xc}$, and $R^{Xd}$ are hydrogen atoms, halogen atoms, or lower carbon substituents, and the other one is a group of the formula (3); two of them are hydrogen atoms, halogen atoms, or lower carbon substituents, and the other two are groups of the formula (3); one of them is a hydrogen atom, a halogen atom, or a lower carbon substituent, and the other three are groups of the formula (3); or all of them are groups of the formula (3). More specifically, for example, $R^{Xa}$ $R^{Xb}$, $R^{Xc}$, and $R^{Xd}$ may be as follows:
(i) $R^{Xa}$, $R^{Xb}$, and $R^{Xc}$ are hydrogen atoms, halogen atoms, or lower carbon substituents, and $R^{Xd}$ is a group of the formula (3);
(ii) $R^{Xa}$ and $R^{Xb}$ are hydrogen atoms, halogen atoms, or lower carbon substituents, and $R^{Xc}$ and $R^{Xd}$ are groups of the formula (3);
(iii) $R^{Xa}$ is a hydrogen atom, a halogen atom, or a lower carbon substituent, and $R^{Xb}$ $R^{Xc}$, and $R^{Xd}$ are groups of the formula (3); or
(iv) all of $R^{Xa}$, $R^{Xb}$, $R^{Xc}$, and $R^{Xd}$ are groups of the formula (3). Of $R^{Xa}$ $R^{Xb}$, $R^{Xc}$, and $R^{Xd}$, one or more members that are not groups of the formula (3) are more preferably hydrogen atoms or lower carbon substituents.

In the formula (1), $R^{Xa}$, $R^{Xb}$, $R^{Xc}$, and $R^{Xd}$ may be the same or different. Therefore, (i) when $R^{Xa}$, $R^{Xb}$, and $R^{Xc}$ are hydrogen atoms, halogen atoms, or lower carbon substituents, and when $R^{Xd}$ is a group of the formula (3), $R^{Xa}$, $R^{Xb}$, and $R^{Xc}$ may be the same or different. (ii) When $R^{Xa}$ and $R^{Xb}$ are hydrogen atoms, halogen atoms, or lower carbon substituents, and when $R^{Xc}$ and $R^{Xd}$ are groups of the formula (3), $R^{Xa}$ and $R^{Xb}$ may be the same or different, and $R^{Xc}$ and $R^{Xd}$ may also be the same or different. (iii) When $R^{Xa}$ is a hydrogen atom, a halogen atom, or a lower carbon substituent, and when $R^{Xb}$, $R^{Xc}$, and $R^{Xd}$ are groups of the formula (3), $R^{Xb}$, $R^{Xc}$, and $R^{Xd}$ may be the same or different. (iv) When all of $R^{Xa}$, $R^{Xb}$, $R^{Xc}$, and $R^{Xd}$ are groups of the formula (3), $R^{Xa}$, $R^{Xb}$, $R^{Xc}$, and $R^{Xd}$ may be the same or different. In any of these cases, the groups of the formula (3) are preferably the same.

Moreover, when two or three of $R^{Xa}$ $R^{Xb}$, $R^{Xc}$, and $R^{Xd}$ are halogen atoms or lower carbon substituents, these halogen atoms or lower carbon substituents may also be the same or different. In this case, two or three of $R^{Xa}$, $R^{Xb}$, $R^{Xc}$, and $R^{Xd}$ are more preferably the same lower carbon substituents.

In the present specification, the lower carbon substituent refers to a lower alkyl group, a lower alkoxy group, or a lower alkenyl group. The term "lower" used herein means 1 to 6 (1, 2, 3, 4, 5, or 6) carbon atoms. Of the lower carbon substituents, a lower alkyl group or a lower alkoxy group is preferable. Specifically, preferable examples of lower alkyl groups include a methyl group, an ethyl group, an n-propyl group, an isopropyl group, an n-butyl group, an isobutyl group, and the like. Preferable examples of lower alkoxy groups include a methoxy group, an ethoxy group, a propoxy group, an isopropoxy group, a butoxy group, an isobutoxy group, and the like.

Moreover, in the present specification, the halogen atom is a fluorine atom, a chlorine atom, a bromine atom, or an iodine atom; preferably a fluorine atom, a chlorine atom, or a bromine atom; and more preferably a fluorine atom or a bromine atom.

In the formula (1), X ring is a saturated hydrocarbon ring or an unsaturated hydrocarbon ring, or rings having a structure in which 2 to 6 saturated hydrocarbon rings and/or unsaturated hydrocarbon rings are condensed, or in which 2 saturated hydrocarbon rings and/or unsaturated hydrocarbon rings are connected. In the present specification, the saturated hydrocarbon ring is, for example, preferably a $C_{4-8}$ (4, 5, 6, 7, or 8) saturated hydrocarbon ring, and particularly preferably a cyclopentane ring, a cyclohexane ring, or the like. In the present specification, the unsaturated hydrocarbon ring is, for example, preferably a $C_{4-8}$ (4, 5, 6, 7, or 8) unsaturated hydrocarbon ring, and particularly preferably a benzene ring or the like. In the present specification, the rings having a structure in which 2 to 6 saturated hydrocarbon rings and/or unsaturated hydrocarbon rings are condensed are preferably 2, 3, or 4 condensed saturated hydrocarbon rings and/or unsaturated hydrocarbon rings, and more preferably 2 or 3 condensed saturated hydrocarbon rings and/or unsaturated hydrocarbon rings. More specific examples include a decahydronaphthalene ring, an adamantane ring, a naphthalene ring, a phenanthrene ring, an anthracene ring, a pyrene ring, a triphenylene ring, a tetralin ring, 1,2,3,4,5,6,7,8-octahydronaphthalene ring, a norbornene ring, and the like.

In the present specification, a saturated hydrocarbon ring or an unsaturated hydrocarbon ring, or rings having a structure in which 2 to 6 saturated hydrocarbon rings and/or unsaturated hydrocarbon rings are condensed, are also collectively referred to as "hydrocarbon rings."

The rings having a structure in which 2 saturated hydrocarbon rings and/or unsaturated hydrocarbon rings are connected are preferably rings represented by the formula (2):

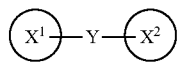

(2)

In the formula (2), $X^1$ ring and $X^2$ ring are the same or different, and each is a saturated hydrocarbon ring or an unsaturated hydrocarbon ring. That is, the $X^1$ ring and $X^2$ ring are both saturated hydrocarbon rings or unsaturated hydrocarbon rings; or one of them is a saturated hydrocarbon ring, and the other is an unsaturated hydrocarbon ring. It is preferable that the $X^1$ ring and the $X^2$ ring be both saturated hydrocarbon rings or unsaturated hydrocarbon rings. For example, it is preferable that the $X^1$ ring and the $X^2$ ring be both benzene rings or cyclohexane rings, or that one of them be a benzene ring and the other be a cyclohexane ring; and it is more preferable that both of them be benzene rings.

Moreover, Y is a bond, a $C_{1-6}$ alkylene group that may be substituted with a $C_{1-4}$ alkyl group, an oxygen atom (—O—), a sulfur atom (—S—), —SO—, or —SO$_2$—. Examples of the $C_{1-6}$ alkylene group include a methylene group, an ethylene group, a trimethylene group, a tetramethylene group, a hexamethylene group, and the like. Moreover, examples of the $C_1$-4 alkyl group as a substituent include a methyl group, an ethyl group, an n-propyl group, an isopropyl group, an n-butyl group, an isobutyl group, and the like. Preferable examples of the $C_{1-6}$ alkylene group substituted with a $C_{1-4}$ alkyl group include —CH(CH$_3$)—, —C(CH$_3$)$_2$—, —CH$_2$CH(CH$_3$)CH$_2$—, —CH$_2$C(CH)$_2$CH$_2$—, and the like. Y is preferably a bond, an oxygen atom, a methylene group, a dimethylmethylene group, —S—, or —SO$_2$—; and more preferably a bond, a dimethylmethylene group, an oxygen atom, or —SO$_2$—.

The rings represented by the formula (2) are substituted with $R^{Xa}$, $R^{Xb}$, $R^{Xc}$, and $R^{Xd}$. When the X ring of the formula (1) is rings represented by the formula (2), when three of $R^{Xa}$ to $R^{Xd}$ are hydrogen atoms, halogen atoms, or lower carbon substituents, and when the other one is a group of the formula (3), one of the $X^1$ ring and $X^2$ ring may be substituted with a group of the formula (3). In this case, the rings represented by the formula (2) are substituted with 0, 1, 2, or 3 halogen atoms or lower carbon substituents, and (number of halogen atoms or lower carbon substituents substituted in $X^1$ ring:number of halogen atoms or lower carbon substituents substituted in $X^2$ ring) can be (1:0), (0:1), (2:0), (1:1), (0:2), (3:0), (2:1), (1:2), or (0:3). When two of $R^{Xa}$ to $R^{Xd}$ are hydrogen atoms, halogen atoms, or lower carbon substituents, and when the other two are groups of the formula (3), one of the $X^1$ ring and $X^2$ ring may be substituted with 2 groups of the formula (3), or the $X^1$ ring and the $X^2$ ring each may be substituted with a group of the formula (3). It is preferable that the $X^1$ ring and the $X^2$ ring each be substituted with a group of the formula (3). In this case, the rings represented by the formula (2) are substituted with 0, 1, or 2 halogen atoms or lower carbon substituents, and (number of halogen atoms or lower carbon substituents substituted in $X^1$ ring:number of halogen atoms or lower carbon substituents substituted in $X^2$ ring) can be (1:0), (0:1), (2:0), (1:1), or (0:2). When one of $R^{Xa}$ to $R^{Xd}$ is a hydrogen atom, a halogen atom, or a lower carbon substituent, and when the other three are groups of the formula (3), one of the $X^1$ ring and $X^2$ ring may be substituted with 3 groups of the formula (3); the $X^1$ ring may be substituted with 2 groups of the formula (3), and the $X^2$ ring may be substituted with 1 group of the formula (3); or the $X^1$ ring may be substituted with 1 group of the formula (3), and the $X^2$ ring may be substituted with 2 groups of the formula (3). It is preferable that the $X^1$ ring be substituted with 2 groups of the formula (3), and the $X^2$ ring be substituted with 1 group of the formula (3); or that the $X^1$ ring be substituted with 1 group of the formula (3), and the $X^2$ ring be substituted with 2 groups of the formula (3). In this case, the rings represented by the formula (2) are substituted with 0 or 1 halogen atom or lower carbon substituent, and (number of halogen atoms or lower carbon substituents substituted in $X^1$ ring:number of halogen atoms or lower carbon substituents substituted in $X^2$ ring) may be (1:0) or (0:1). When all of $R^{Xa}$ to $R^{Xd}$ are groups of the formula (3), one of the $X^1$ ring and the $X^2$ ring may be substituted with 4 groups of the formula (3); the $X^1$ ring may be substituted with 3 groups of the formula (3), and the $X^2$ ring may be substituted with 1 group of the formula (3); the $X^1$ ring may be substituted with 1 group of the formula (3), and the $X^2$ ring may be substituted with 3 groups of the formula (3); or the $X^1$ ring may be substituted with 2 groups of the formula (3), and the $X^2$ ring may be substituted with 2 groups of the formula (3). It is preferable that the $X^1$ ring be substituted with 2 groups of the formula (3), and the $X^2$ ring be substituted with 2 groups of the formula (3).

As a group of the formula (1), a tetravalent group represented by the formula (1'):

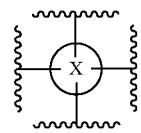

(1')

wherein in the formula (1'), X ring is as defined above;

is particularly preferably a group represented by the following formula. Specifically, the group is represented by the following formula:

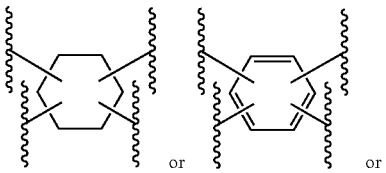

-continued

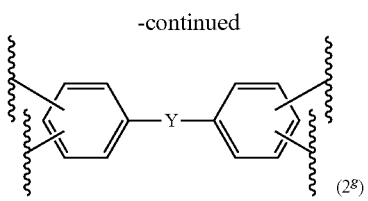

(2g)

wherein in the formula (2g), Y is as defined above.

In the formula (3), $R^1$ is the same or different, and is a $C_{1-18}$ alkyl group, a $C_{2-9}$ alkenyl group, a cycloalkyl group, an aryl group, or an aralkyl group, wherein one or more carbon atoms of these groups may be replaced by at least one atom selected from the group consisting of an oxygen atom and a nitrogen atom (preferably an oxygen atom). The one or more carbon atoms are preferably carbon atoms that are not directly bonded to the silicon atom. The one or more carbon atoms that may be replaced are one or plural (e.g., 2, 3, 4, 5, or 6) carbon atoms, and preferably one carbon atom. In terms of ease of synthesis etc., it is preferable that $R^1$ bonded to the same silicon atom be the same. It is more preferable that all $R^1$ present in the formula (1) be the same.

The $C_{1-18}$ alkyl group represented by $R^1$ is, for example, a linear or branched alkyl group. Examples include a methyl group, an ethyl group, an n-propyl group, an isopropyl group, an n-butyl group, an isobutyl group, a tert-butyl group, an n-pentyl group, a neopentyl group, a tert-pentyl group, an n-hexyl group, an n-heptyl group, a 2,2,4-trimethylpentyl group, an n-octyl group, an isooctyl group, an n-nonyl group, an n-decyl group, an n-dodecyl group, and the like. Preferable is a $C_{1-10}$ alkyl group, more preferable is a $C_{1-6}$ alkyl group, even more preferable is a $C_{1-3}$ alkyl group, and particularly preferable is a methyl group.

The $C_{2-9}$ alkenyl group represented by $R^1$ is, for example, a linear or branched alkenyl group. Examples include a vinyl group, an allyl group, a 2-propenyl group, a butenyl group, a pentenyl group, a hexenyl group, a heptenyl group, an octenyl group, a nonenyl group, and the like. Preferable is a $C_{2-4}$ alkenyl group.

The cycloalkyl group represented by $R^1$ is, for example, a 3- to 8-membered ring cycloalkyl group. Examples include a cyclopentyl group, a cyclohexyl group, a cycloheptyl group, a methylcyclohexyl group, and the like.

The aryl group represented by $R^1$ is, for example, a monocyclic or bicyclic aryl group. Examples include a phenyl group, a tolyl group, a xylyl group, an ethyl phenyl group, a naphthyl group, and the like. Preferable is a phenyl group.

The aralkyl group represented by $R^1$ is, for example, a $C_{1-4}$ alkyl group substituted with an aryl group (particularly a phenyl group). Examples include a benzyl group, an α-phenethyl group, a β-phenethyl group, a β-methylphenethyl group, and the like.

$R^1$ is preferably a $C_{1-3}$ alkyl group, and more preferably a methyl group.

In the formula (3), $R^2$ is a $C_{1-18}$ alkylene group. The alkylene group is a linear or branched alkylene group, and preferably a linear alkylene group. Examples include a methylene group, a methylmethylene group, an ethylmethylene group, a dimethylmethylene group, a diethylmethylene group, a dimethylene group (—$CH_2CH_2$—), a trimethylene group (—$CH_2CH_2CH_2$—), a tetramethylene group, a pentamethylene group, a hexamethylene group, a heptamethylene group, an octamethylene group, a nonamethylene group, a decamethylene group, an undecamethylene group, a dodecamethylene group, a tridecamethylene group, and the like. Specific examples include a $C_{2-18}$ alkylene group, preferably a $C_{2-10}$ alkylene group, more preferably a $C_{2-8}$ alkylene group, even more preferably a $C_{2-6}$ alkylene group, and particularly preferably a $C_{2-5}$ alkylene group.

One or more carbon atoms of the $C_{1-18}$ alkylene group may be replaced by at least one atom selected from the group consisting of an oxygen atom and a nitrogen atom (preferably an oxygen atom). The one or more carbon atoms are preferably carbon atoms that are not directly bonded to the silicon atom, and the 3- to 8-membered ring or epoxy ring. Moreover, the one or more carbon atoms that may be replaced are one or plural (e.g., 2, 3, 4, 5, or 6) carbon atoms, and preferably one carbon atom.

When the side of $R^2$ binding to the silicon atom is expressed as (*), examples of this group include (*)—$C_{2-9}$ alkylene-O—$C_{1-8}$ alkylene-, preferably (*)—$C_{2-4}$ alkylene-O—$C_{1-3}$ alkylene-, more preferably (*)—$C_{2-4}$ alkylene-O—$C_{1-2}$ alkylene-, and particularly preferably (*)—$C_3$ alkylene-O-methylene-.

Specific examples include (*)—$(CH_2)_2$—O—$CH_2$—, (*)—$(CH_2)_3$—O—$CH_2$—, (*)—$(CH_2)_3$—O—$(CH_2)_2$—, (*)—$(CH_2)_5$—O—$(CH_2)_4$—, and the like; of these, (*)—$(CH_2)_3$—O—$CH_2$ is preferable.

In the formula (3), m is an integer of 0 to 6 (i.e., 0, 1, 2, 3, 4, 5, or 6). Moreover, n is an integer of 0 to 3 (i.e., 0, 1, 2, or 3). The group bonded to $R^2$ of the formula (3) (on the side not binding to the silicon atom) is represented by the formula (4) (hereafter also referred to as "the group of the formula (4)"), as shown below.

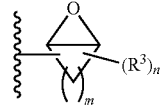

(4)

The group of the formula (4) wherein m is an integer of 1 to 6 is specifically described by the following structural formulas.

When m=1,

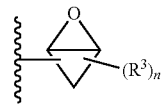

When m=2,

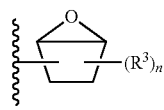

When m=3,

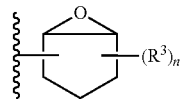

When m=4,

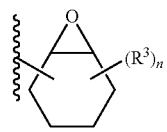

When m=5,

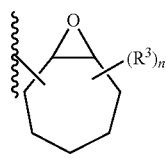

When m=6,

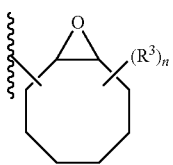

When m is 0, only an epoxy ring remains, and n is an integer of 0 to 3; thus, the group of the formula (4) is a group represented by any of the following formulas:

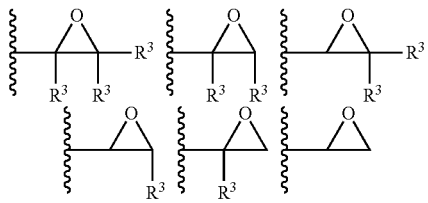

In the formula (3), $R^2$ and $R^3$ bind to a 3- to 8-membered ring or an epoxy ring. n represents the number of $R^3$ binding to the 3- to 8-membered ring or the epoxy ring.

In the formula (3), $R^3$ is the same or different, and is a $C_{1-18}$ alkyl group, a $C_{2-9}$ alkenyl group, a cycloalkyl group, an aryl group, or an aralkyl group. One or more carbon atoms of these groups may be replaced by at least one atom selected from the group consisting of an oxygen atom and a nitrogen atom. The one or more carbon atoms are preferably carbon atoms that are not directly bonded to the 3- to 8-membered ring or epoxy ring. Moreover, the one or more carbon atoms that may be replaced are one or plural (e.g., 2, 3, 4, 5, or 6) carbon atoms, and preferably one carbon atom.

Examples of the $C_{1-18}$ alkyl group, $C_{2-9}$ alkenyl group, cycloalkyl group, aryl group, and aralkyl group represented by $R^3$ include the same corresponding substituents represented by $R^1$ described above.

$R^3$ is preferably a $C_{1-3}$ alkyl group, and more preferably a methyl group or an ethyl group.

Preferable examples of the group of the formula (3) include groups wherein $R^1$, $R^2$, $R^3$, m, and n are as defined above; all $R^1$ are the same; and all $R^3$ are the same (when there are plural $R^3$). The number of this group present in the epoxy resin represented by the formula (1) is 1, 2, 3, or 4; and they may be the same or different, and are preferably the same.

Particularly preferable specific examples of the group of the formula (4) include groups wherein $R^3$ is as defined above; m is 0, 1, 2, 3, or 4; and n is 0, 1, or 2. More preferable among these are the following groups (all $R^3$ are as defined above):

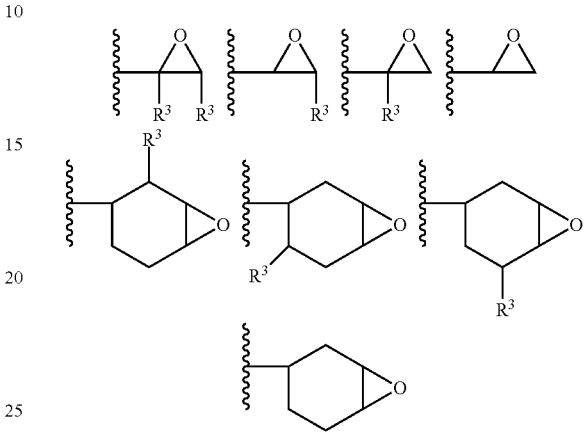

The number of groups of the formula (4) present in the epoxy resin represented by the formula (1) is 1, 2, 3, or 4; and they may be the same or different, and are preferably the same.

Moreover, one or more hydrogen atoms bonded to one or more carbon atoms that constitute the hydrocarbon ring constituting the X ring, and that are not bonded to $R^{Xa}$, $R^{Xb}$, $R^{Xc}$, or $R^{Xd}$, may be replaced by a lower carbon substituent or a halogen atom (preferably a lower carbon substituent). That is, when the X ring is a saturated hydrocarbon ring or an unsaturated hydrocarbon ring, or rings having a structure in which 2 to 6 saturated hydrocarbon rings and/or unsaturated hydrocarbon rings are condensed, one or more hydrogen atoms bonded to one or more carbon atoms that constitute these rings, and that are not bonded to $R^{Xa}$, $R^{Xb}$, $R^{Xc}$, or $R^{Xd}$, may be replaced by a lower carbon substituent or a halogen atom (preferably a lower carbon substituent). When the X ring is rings having a structure in which 2 saturated hydrocarbon rings and/or unsaturated hydrocarbon rings are connected, one or more hydrogen atoms bonded to one or more carbon atoms that constitute theses connected saturated hydrocarbon rings and/or unsaturated hydrocarbon rings, and that are not bonded to $R^{Xa}$, $R^{Xb}$, $R^{Xc}$, or $R^{Xd}$, may be replaced by a lower carbon substituent or a halogen atom (preferably a lower carbon substituent). When the case in which the X ring is rings represented by the formula (2) is explained in detail, one or more hydrogen atoms bonded to one or more carbon atoms that constitute the $X^1$ ring and $X^2$ ring, and that are not bonded to $R^{Xa}$, $R^{Xb}$, $R^{Xc}$, or $R^{Xd}$, may be replaced by a lower carbon substituent or a halogen atom (preferably a lower carbon substituent).

In the present specification, carbon atoms that constitute the hydrocarbon ring constituting the X ring, and that are not bonded to $R^{Xa}$, $R^{Xb}$, $R^{Xc}$, and $R^{Xd}$, are also referred to as "$R^{Xa-d}$ non-binding carbon atoms."

The lower carbon substituent or halogen atom that may replace one or more hydrogen atoms bonded to one or more $R^{Xa-d}$ non-binding carbon atoms is preferably singly bonded to one $R^{Xa-d}$ non-binding carbon atom. That is, when hydrogen atoms bonded to $R^{Xa-d}$ non-binding carbon atoms are replaced, only one of the hydrogen atoms bonded to the $R^{Xa-d}$ non-binding carbon atoms is preferably replaced by a lower carbon substituent or halogen atom. Moreover, the number of substituents (i.e., the total number of lower carbon substituents and halogen atoms) is more preferably less than the number of $R^{Xa-d}$ non-binding carbon atoms. More specifically, the number of substituents is preferably 1 to 6 (1, 2, 3, 4, 5, or 6), more preferably 1 to 4, and even more preferably 1 or 2. Particularly when the X ring is rings represented by the formula (2), one or more hydrogen atoms to be replaced are preferably hydrogen atoms bonded to carbon atoms that are not bonded to Y.

When at least one of $R^{Xa}$, $R^{Xb}$, $R^{Xc}$, and $R^{Xd}$ is a lower carbon substituent, and when at least one lower carbon substituent is bonded to an $R^{Xa-d}$ non-binding carbon atom, all of the lower carbon substituents are preferably the same. That is, when there are lower carbon substituents among $R^{Xa}$, $R^{Xb}$, $R^{Xc}$, and $R^{Xd}$, and when there are lower carbon substituents bonded to $R^{Xa-d}$ non-binding carbon atoms, all of the lower carbon substituents are preferably the same. Moreover, although it is not particularly limited, when at least one of $R^{Xa}$, $R^{Xb}$, $R^{Xc}$, and $R^{Xd}$ is a halogen atom, and when at least one halogen atom is bonded to an $R^{Xa-d}$ non-binding carbon atom, all of the halogen atoms are preferably the same. That is, when there are halogen atoms among $R^{Xa}$, $R^{Xb}$, $R^{Xc}$, and $R^{Xd}$, and when there are halogen atoms bonded to $R^{Xa-d}$ non-binding carbon atoms, all of the halogen atoms are preferably the same.

More specifically, for example, when the tetravalent group represented by the above formula (1') is the following:

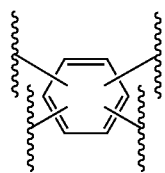

preferable examples of the epoxy resin represented by the formula (1) include an epoxy resin represented by the formula (1-X1):

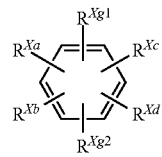

(1-X1)

wherein in the formula (1-X1), $R^{Xa}$, $R^{Xb}$, $R^{Xc}$, and $R^{Xd}$ are as defined above; and $R^{Xg1}$ and $R^{Xg2}$ are the same or different, and each is a hydrogen atom, a lower alkyl group, a lower alkoxy group, or a lower alkenyl group.

In the formula (1-X1), $R^{Xa}$, $R^{Xb}$, $R^{Xc}$, $R^{Xd}$, $R^{Xg1}$, and $R^{Xg2}$ are more preferably each bonded to a different carbon atom on the benzene ring. Among the epoxy resins represented by the formula (1-X1), one wherein $R^{Xg1}$ and $R^{Xg2}$ are hydrogen atoms is preferable.

More preferable examples of the epoxy resin represented by the formula (1-X1) include:

an epoxy resin represented by the formula (1-X1a):

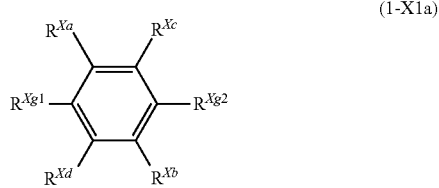

(1-X1a)

wherein in the formula (1-X1a), $R^{Xa}$, $R^{Xb}$, $R^{Xc}$, and $R^{Xd}$ are as defined above; and $R^{Xg1}$ and $R^{Xg2}$ are as defined above; and an epoxy resin represented by the formula (1-X1b):

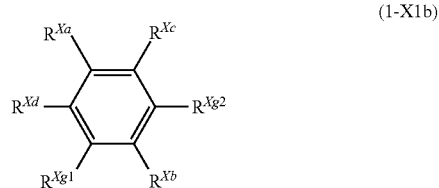

(1-X1b)

wherein in the formula 1-X1b, $R^{Xa}$, $R^{Xb}$, $R^{Xc}$, and $R^{Xd}$ are as defined above; and $R^{Xg1}$ and $R^{Xg2}$ are as defined above.

More preferable among the epoxy resins represented by the formula (1-X1a) are, for example, those wherein $R^{Xa}$ and $R^{Xb}$ are hydrogen atoms, $R^{Xc}$ and $R^{Xd}$ are groups of the formula (3), and $R^{Xg1}$ and $R^{Xg2}$ are hydrogen atoms; and those wherein $R^{Xa}$ and $R^{Xc}$ are hydrogen atoms, $R^{Xb}$ and $R^{Xd}$ are groups of the formula (3), and $R^{Xg1}$ and $R^{Xg2}$ are hydrogen atoms.

More preferable among the epoxy resins represented by the formula (1-X1b) are, for example, those wherein $R^{Xa}$ is a hydrogen atom, $R^{Xb}$, $R^{Xc}$, and $R^{Xd}$ are groups of the formula (3), and $R^{Xg1}$ and $R^{Xg2}$ are hydrogen atoms.

Moreover, when the tetravalent group represented by the above formula (1') is a group represented by the following formula:

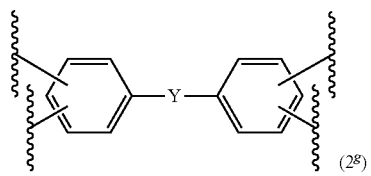

(2$^g$)

wherein in the formula (2$^g$), Y is as defined above;
preferable examples of the epoxy resin represented by the formula (1) also include an epoxy resin represented by the formula (1-X2):

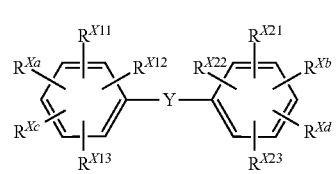

(1-X2)

wherein in the formula (1-X2), Y is as defined above; $R^{Xa}$, $R^{Xb}$, $R^{Xc}$, and $R^{Xd}$ are as defined above; and $R^{X11}$, $R^{X12}$, and $R^{X13}$, as well as $R^{X21}$, $R^{X22}$, and $R^{X23}$ are the same or different, and each is a hydrogen atom, a lower alkyl group, a lower alkoxy group, or a lower alkenyl group.

In the formula (1-X2), $R^{Xa}$, $R^{Xc}$, $R^{X11}$, $R^{X12}$, and $R^{X13}$ preferably each bind to a different carbon atom; and $R^{Xb}$, $R^{Xd}$, $R^{X21}$, $R^{X22}$, and $R^{X23}$ more preferably each bind to a different carbon atom. None of $R^{Xa}$, $R^{Xb}$, $R^{Xc}$, $R^{Xd}$, $R^{X11}$, $R^{X12}$, $R^{X13}$, $R^{X21}$, $R^{X22}$, and $R^{X23}$ binds to a carbon atom bonded to Y.

More preferable among the epoxy resins represented by the formula (1-X2) are:

an epoxy resin represented by the formula (1-X2a):

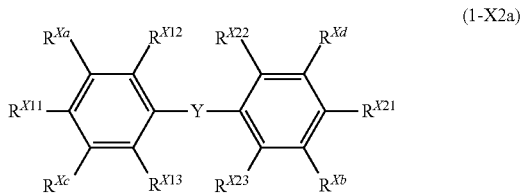

(1-X2a)

wherein in the formula (1-X2a), Y is as defined above; $R^{Xa}$, $R^{Xb}$, $R^{Xc}$, and $R^{Xd}$ are as defined above; and $R^{X11}$, $R^{X12}$, and $R^{X13}$, as well as $R^{X21}$, $R^{X22}$, and $R^{X23}$ are the same or different, and each is a hydrogen atom, a lower alkyl group, a lower alkoxy group, or a lower alkenyl group;

an epoxy resin represented by the formula (1-X2b):

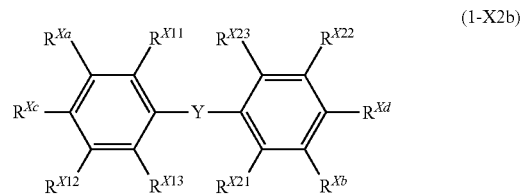

(1-X2b)

wherein in the formula (1-X2b), Y is as defined above; $R^{Xa}$, $R^{Xb}$, $R^{Xc}$, and $R^{Xd}$ are as defined above; and $R^{X11}$, $R^{X12}$, and $R^{X13}$, as well as $R^{X21}$, $R^{X22}$, and $R^{X23}$ are the same or different, and each is a hydrogen atom, a lower alkyl group, a lower alkoxy group, or a lower alkenyl group; and an epoxy resin represented by the formula (1-X2c):

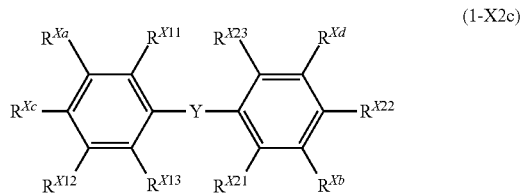

(1-X2c)

wherein in the formula (1-X2c), Y is as defined above; $R^{Xa}$, $R^{Xb}$, $R^{Xc}$, and $R^{Xd}$ are as defined above; and $R^{X11}$, $R^{X12}$, and $R^{X13}$, as well as $R^{X21}$, $R^{X22}$, and $R^{X23}$ are the same or different, and each is a hydrogen atom, a lower alkyl group, a lower alkoxy group, or a lower alkenyl group.

More preferable among the epoxy resins represented by the formula (1-X2a) are, for example, those wherein $R^{Xa}$, $R^{Xb}$, $R^{Xc}$, and $R^{Xd}$ are groups of the formula (3); $R^{X11}$ and $R^{X21}$ are lower carbon substituents; and $R^{X12}$, $R^{X13}$, $R^{X22}$, and $R^{X23}$ are hydrogen atoms. Particularly preferable are those wherein Y is a $C_{1-6}$ alkylene group that may be substituted with a $C_{1-4}$ alkyl group (particularly —C(CH$_3$)$_2$—); $R^{Xa}$, $R^{Xb}$, $R^{Xc}$, and $R^{Xd}$ are groups of the formula (3); $R^{X11}$ and $R^{X21}$ are lower alkoxy groups; and $R^{X12}$, $R^{X13}$, $R^{X22}$, and $R^{X23}$ are hydrogen atoms. In these cases, it is more preferable that all of the groups of the formula (3) as $R^{Xa}$, $R^{Xb}$, $R^{Xc}$, and $R^{Xd}$ be the same, and that the lower carbon substituents as $R^{X11}$ and $R^{X21}$ be the same.

Preferable among the epoxy resins represented by the formula (1-X2b) are, for example, those wherein $R^{Xa}$ and $R^{Xb}$ are hydrogen atoms; $R^{Xc}$ and $R^{Xd}$ are groups of the formula (3); and $R^{X11}$, $R^{X12}$, $R^{X13}$, $R^{X21}$ $R^{X22}$, and $R^{X23}$ are hydrogen atoms. In this case, it is more preferable that the groups of the formula (3) as $R^{Xc}$ and $R^{Xd}$ be the same.

Preferable among the epoxy resins represented by the formula (1-X2c) are, for example, those wherein $R^{Xa}$ is a hydrogen atom; $R^{Xb}$, $R^{Xc}$, and $R^{Xd}$ are groups of the formula (3); and $R^{X11}$, $R^{X12}$, $R^{X13}$, $R^{X21}$, $R^{X22}$, and $R^{X23}$ are hydrogen atoms. In this case, it is more preferable that the groups of the formula (3) as $R^{Xb}$, $R^{Xc}$, and $R^{Xd}$ be the same.

In the present specification, the explanations relating to the X ring, $R^{Xa}$, $R^{Xb}$, $R^{Xc}$, and $R^{Xd}$ in the formula (1), and $R^1$, $R^2$, $R^3$, m, and n in the group of the formula (3), including the explanation about the group of the formula (4), can be combined in any way. Any epoxy resins represented by combinations thereof can be also used in the present invention.

The formula (1) can satisfy any of the following:

(iia) one or more hydrogen atoms bonded to one or more $R^{Xa-d}$ non-binding carbon atoms are not replaced; $R^{Xa}$ and $R^{Xb}$ of $R^{Xa}$, $R^{Xb}$, $R^{Xc}$, and $R^{Xd}$ are hydrogen atoms; and $R^{Xc}$ and $R^{Xd}$ are groups of the formula (3);

(iiia) one or more hydrogen atoms bonded to one or more $R^{Xa-d}$ non-binding carbon atoms are not replaced; $R^{Xa}$ of $R^{Xa}$, $R^{Xb}$, $R^{Xc}$, and $R^{Xd}$ is a hydrogen atom; and $R^{Xb}$, $R^{Xc}$, and $R^{Xd}$ are groups of the formula (3); or (iva) one or more hydrogen atoms bonded to one or more $R^{Xa-d}$ non-binding carbon atoms are not replaced; and all of $R^{Xa}$, $R^{Xb}$, $R^{Xc}$, and $R^{Xd}$ are groups of the formula (3).

In the case of (iia), preferable examples of the epoxy resin represented by the formula (1) include an epoxy resin represented by the following formula (1-iia):

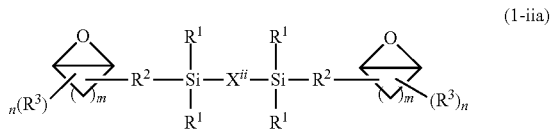

(1-iia)

wherein $X^{ii}$ is a divalent group obtained by removing two hydrogen atoms from a hydrocarbon ring, or a divalent group represented by the formula (2$^g$-iia):

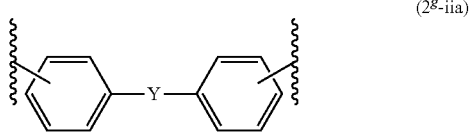

(2$^g$-iia)

wherein Y is as defined above; and
$R^1$, $R^2$, $R^3$, m, and n are as defined above.
$R^1$, $R^2$, $R^3$, m, and n each may be the same or different, and are preferably the same.

The divalent group represented by $X^{ii}$ is preferably a cyclohexane-1,4-diyl group or a 1,4-phenylene group; and more preferably a 1,4-phenylene group.

Preferable among the divalent groups represented by the formula (2$^g$-iia) is a group represented by the formula (2$^g$-iia'):

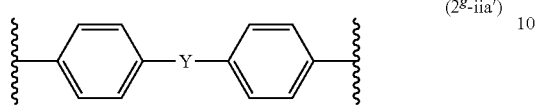

(2$^g$-iia')

wherein Y is as defined above.

In the formula (2$^g$-iia'), Y is preferably a bond, a dimethylmethylene group, an oxygen atom, or —SO$_2$—.

$X^{ii}$ is preferably a cyclohexane-1,4-diyl group, a 1,4-phenylene group, or a group of the formula (2$^g$-iia'); and more preferably a 1,4-phenylene group.

The present invention can more preferably use, for example, an epoxy resin represented by the formula (1-iia), wherein m is the same and is 0, 1, 2, 3, or 4 (particularly preferably m is the same and is 0 or 4); n is the same and is 0 (that is, the ring is not substituted with R$^3$); $X^{ii}$ is a divalent group obtained by removing two hydrogen atoms from a hydrocarbon ring (particularly preferably a benzene ring); R$^1$ is the same and is a C$_{1-3}$ alkyl group; and R$^2$ is the same and is a C$_{2-6}$ alkylene group, wherein one carbon atom that is not directly bonded to the silicon atom, and the 3- to 6-membered ring or epoxy ring may be replaced by an oxygen atom.

In the case of (iiia), the epoxy resins represented by the formula (1) preferably include an epoxy resin represented by the following formula (1-iiia):

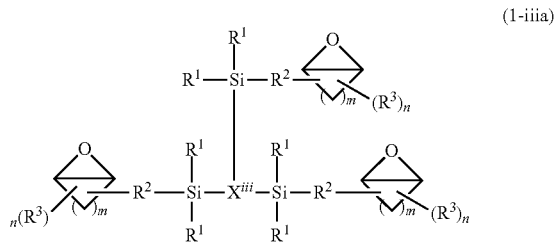

(1-iiia)

wherein $X^{iii}$ is a trivalent group obtained by removing three hydrogen atoms from a hydrocarbon ring, or a trivalent group represented by the formula (2$^g$-iiia):

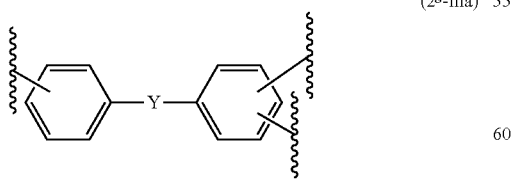

(2$^g$-iiia)

wherein Y is as defined above; and
R$^1$, R$^2$, R$^3$, m, and n are as defined above.
R$^1$, R$^2$, R$^3$, m, and n each may be the same or different, and are preferably the same.

Preferable examples of the trivalent group represented by $X^{iii}$ include the following groups:

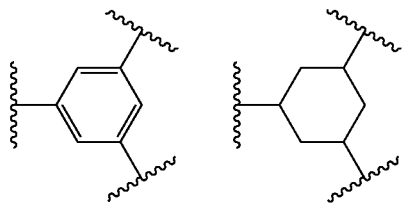 [SMILES: *c1cc(*)cc(*)c1 ; *C1CC(*)CC(*)C1]

Preferable among the trivalent groups represented by the formula (2$^g$-iiia) include a group represented by the formula (2$^g$-iiia'):

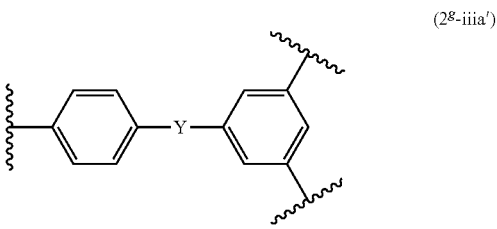

(2$^g$-iiia')

wherein Y is as defined above.

In the formula (2$^g$-iiia'), Y is particularly preferably a bond, a dimethylmethylene group, an oxygen atom, or —SO$_2$—.

The present invention can more preferably use, for example, an epoxy resin represented by the formula (1-iiia), wherein m is the same and is 0, 1, 2, 3, or 4 (particularly preferably m is the same and is 0 or 4); n is the same and is 0 (that is, the ring is not substituted with R$^3$); $X^{iii}$ is a trivalent group obtained by removing three hydrogen atoms from a hydrocarbon ring (particularly preferably a benzene ring); R$^1$ is the same and is a C$_{1-3}$ alkyl group; and R$^2$ is the same and is a C$_{2-6}$ alkylene group, wherein one carbon atom that is not directly bonded to the silicon atom and the 3- to 6-membered ring or epoxy ring may be replaced by an oxygen atom.

In the case of (iva), the epoxy resins represented by the formula (1) include an epoxy resin represented by the following formula (1-iva):

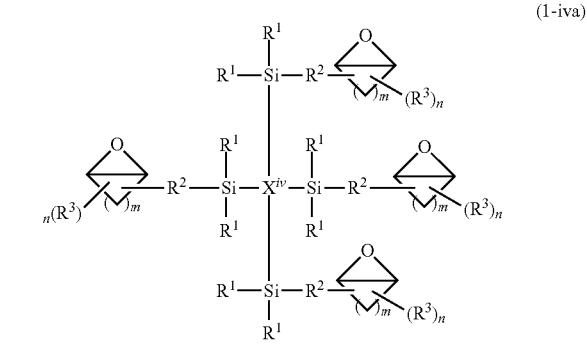

(1-iva)

wherein $X^{iv}$ is a tetravalent group represented by the above formula (1'), wherein one or more hydrogen atoms bonded to one or more R$^{Xa-d}$ non-binding carbon atoms in the X ring are not replaced; and R$^1$, R$^2$, R$^3$, m, and n are as defined above.

$R^1$, $R^2$, $R^3$, m, and n each may be the same or different, and are preferably the same.

Preferable examples of the tetravalent group represented by $X^{iv}$ include the following groups:

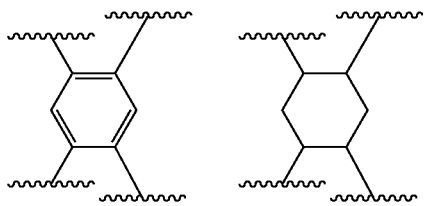 [SMILES: *c1cc(*)c(*)cc1* ; *C1CC(*)C(*)CC1*]

As the tetravalent group represented by $X^{iv}$, among tetravalent groups represented by the formula ($2^g$), wherein one or more hydrogen atoms bonded to one or more $R^{Xa-d}$ non-binding carbon atoms are not replaced, preferable is a group represented by the formula ($2^g$-iva'):

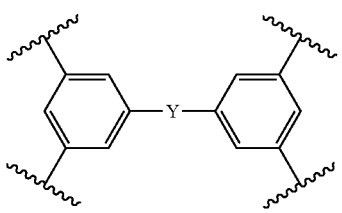

($2^g$-iva')

wherein Y is as defined above.

In the formula ($2^g$-iva'), Y is particularly preferably a bond, a dimethylmethylene group, an oxygen atom, or —SO$_2$—.

The present invention can more preferably use, for example, an epoxy resin represented by the formula (1-iva), wherein m is the same and is 0, 1, 2, 3, or 4 (particularly preferably m is the same and is 0 or 4); n is the same and is 0 (that is, the ring is not substituted with $R^3$); $X^{iv}$ is a tetravalent group obtained by removing four hydrogen atoms from a hydrocarbon ring (particularly preferably a benzene ring); $R^1$ is the same and is a $C_{1-3}$ alkyl group; and $R^2$ is the same and is a $C_{2-6}$ alkylene group, wherein one carbon atom that is not directly bonded to the silicon atom and the 3- to 6-membered ring or epoxy ring may be replaced by an oxygen atom.

More preferable among the epoxy resins represented by the formula (1) are specifically, for example, compounds represented by the formula (1-IIa):

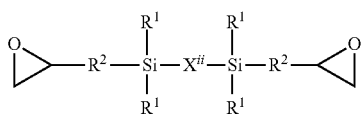

(1-IIa)

wherein $R^1$, $R^2$, and $X^{ii}$ are as defined above.

Preferable among the compounds represented by the formula (1-IIa) are compounds wherein $X^{ii}$ is a 1,4-phenylene group or a group represented by the formula ($2^g$-iia') (preferably a 1,4-phenylene group); $R^1$ is the same or different (preferably the same), and is a $C_{1-3}$ alkyl group (particularly a methyl group); and $R^2$ is the same or different (preferably the same), and is a $C_{2-6}$ alkylene group, (*)—(CH$_2$)$_2$—O—CH$_2$—, (*)—(CH$_2$)$_3$—O—CH$_2$—, (*)—(CH$_2$)$_3$—O—(CH$_2$)$_2$—, or (*)—(CH$_2$)$_5$—O—(CH$_2$)$_4$—. (*) represents the side of $R^2$ binding to the silicon atom, as described above.

More preferable among the epoxy resins represented by the above formula (1-IIa) is:

an epoxy resin represented by the formula (1-IIa1):

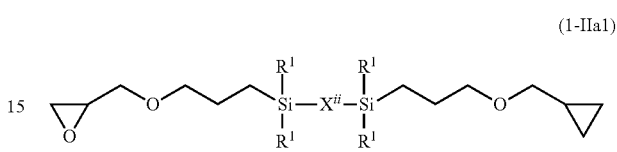

(1-IIa1)

wherein $R^1$ and $X^{ii}$ are as defined above; or an epoxy resin represented by the formula (1-IIa2):

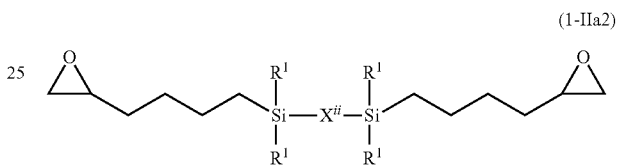

(1-IIa2)

wherein $R^1$ and $X^{ii}$ are as defined above.

$R^1$ may be the same or different, and is preferably the same.

More preferably, in the formula (1-IIa1) or (1-IIa2), $R^1$ is the same or different (preferably the same), and is a $C_{1-3}$ alkyl group (particularly a methyl group); and $X^{ii}$ is a 1,4-phenylene group or a group represented by the formula ($2^g$-iia').

More preferable among the epoxy resins represented by the formula (1) include an epoxy resin represented by the formula (1-IIb):

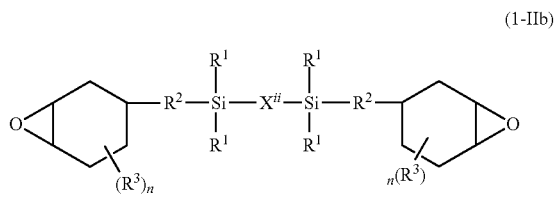

(1-IIb)

wherein $R^1$, $R^2$, $R^3$, $X^{ii}$, and n are as defined above. $R^1$, $R^2$, $R^3$, and n each may be the same or different, and are preferably the same.

More preferably, in the formula (1-IIb), $X^{ii}$ is a 1,4-phenylene group or a group represented by the formula ($2^g$-iia') (preferably a 1,4-phenylene group); $R^1$ is the same or different (preferably the same), and is a $C_{1-3}$ alkyl group (particularly a methyl group); both n is 0 (that is, the ring is not substituted with $R^3$); and $R^2$ is the same or different (preferably the same), and is a $C_{2-6}$ alkylene group (preferably a dimethylene group: —(CH$_2$)$_2$—).

More preferable among the epoxy resins represented by the formula (1) is an epoxy resin represented by the formula (1-IIIa):

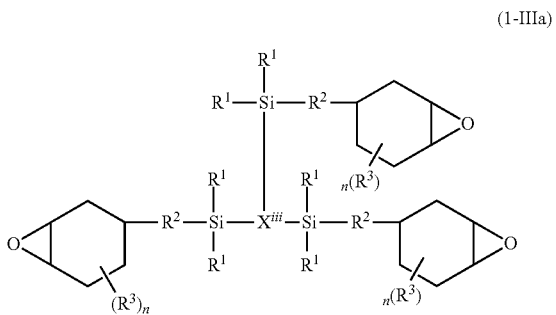

(1-IIIa)

wherein $R^1$, $R^2$, $R^3$, $X^{iii}$, and n are as defined above. $R^1$, $R^2$, $R^3$, and n each may be the same or different, and are preferably the same.

More preferably, in the formula (1-IIIa), $X^{iii}$ is

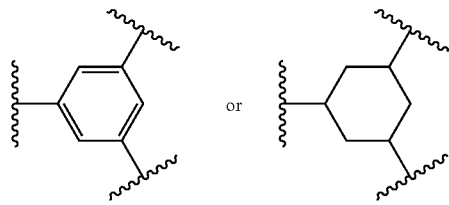 [SMILES: *c1cc(*)cc(*)c1 ; *C1CC(*)CC(*)C1]

or a group represented by the formula ($2^g$-iiia'); $R^1$ is the same or different (preferably the same), and is a $C_{1-3}$ alkyl group (particularly a methyl group); both n is 0 (that is, the ring is not substituted with $R^3$); and $R^2$ is the same or different (preferably the same), and is a $C_{2-6}$ alkylene group (preferably a dimethylene group: —$(CH_2)_2$—).

In the epoxy resin composition of the present invention, the epoxy resins represented by the formula (1) can be used singly or in combination of two or more.

The epoxy resin represented by the formula (1) can be produced by or according to a known method, for example, based on or according to the disclosure of PTL 2 (GB1123960B). Moreover, the epoxy resin represented by the formula (1-iia) can be produced by, for example, a reaction represented by the following reaction formula:

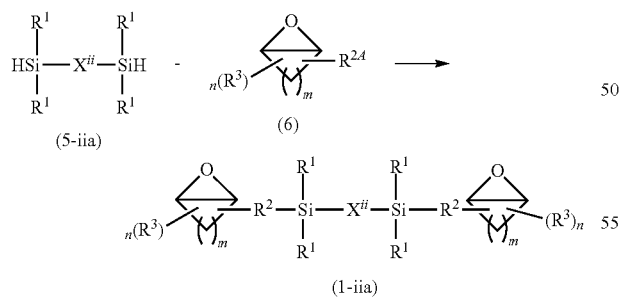

wherein $R^{2A}$ is a $C_{2-18}$ alkenyl group, wherein one or more carbon atoms of this group may be replaced by at least one atom selected from the group consisting of an oxygen atom and a nitrogen atom; and $R^1$, $R^2$, $R^3$, and $X^{ii}$ are as defined above.

The $C_{2-18}$ alkenyl group represented by $R^{2A}$ is a linear or branched alkenyl group, and preferably a linear alkenyl group. Specific examples include a vinyl group, an allyl group, a propenyl group, a butenyl group, a pentenyl group, a hexenyl group, a heptenyl group, an octenyl group, a norbornenyl group, a cyclohexenyl group, and the like. A $C_{2-10}$ alkenyl group is preferable; a $C_{2-8}$ alkenyl group is more preferable; a $C_{2-6}$ alkenyl group is even more preferable; and a vinyl group, an allyl group, or a butenyl group is particularly preferable. The alkenyl group is preferably an α-alkenyl group.

One or more carbon atoms of these $C_{2-18}$ alkylene groups may be replaced by at least one atom selected from the group consisting of an oxygen atom and a nitrogen atom (preferably an oxygen atom). The one or more carbon atoms are preferably carbon atoms that are not directly bonded to the epoxy ring. Moreover, the one or more carbon atoms that may be replaced are one or plural (e.g., 2, 3, 4, 5, or 6) carbon atoms, and preferably one carbon atom. Examples of this group include $C_{2-9}$ alkenyl-O—$C_{1-8}$ alkylene-, preferably $C_{2-4}$ alkenyl-O—$C_{1-3}$ alkylene-, more preferably $C_{2-4}$ alkenyl-O—$C_{1-2}$ alkylene-, and particularly preferably $C_3$ alkenyl-O—$CH_2$—. Specific examples include $CH_2$=CH—O—$CH_2$—, $CH_2$=CH—$CH_2$—O—$CH_2$—, $CH_2$=CH—$CH_2$—O—$(CH_2)_2$—, $CH_2$=CH—$(CH_2)_3$—O—$(CH_2)_4$—, and the like; among these, $CH_2$=CH—$CH_2$—O—$CH_2$— (allyloxymethyl group) is preferable.

The epoxy resin represented by the formula (1-iia) can be produced by hydrosilylation of the compound represented by the formula (5-iia) and the compound represented by the formula (6). Hydrosilylation can be generally performed in the presence of a catalyst in the presence or absence of a solvent. Moreover, when a compound represented by the formula (5-iiia):

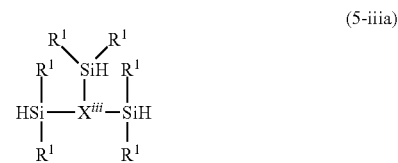

(5-iiia)

wherein $R^1$ and $X^{iii}$ are as defined above; or the formula (5-iva):

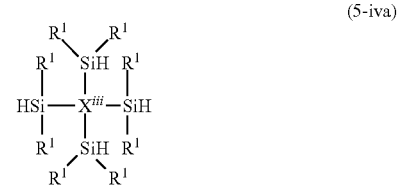

(5-iva)

wherein $R^1$ and $X^{iii}$ are as defined above; or the formula (5-ia):

(5-ia)

wherein $X^i$ is a monovalent group obtained by removing one hydrogen atom from a hydrocarbon ring, and $R^1$ is as defined above;

is used in place of the compound represented by the formula (5-iia), an epoxy resin represented by the above formula (1-iiia) or (1-iva), or an epoxy resin having a structure in which one group of the formula (3) is bonded to a hydrocarbon ring can also be produced. Moreover, various compounds represented by the formula (1) can be produced by using compounds having a structure in which $X^i$ to $X^{iv}$ are each replaced by a monovalent group obtained by removing one hydrogen atom from the X ring, a divalent group obtained by removing two hydrogen atoms from the X ring, a trivalent group obtained by removing three hydrogen atoms from the X ring, or a tetravalent group obtained by removing four hydrogen atoms from the X ring.

The catalyst used in hydrosilylation may be a known catalyst. Examples include platinum-based catalysts, such as platinum carbon, chloroplatinic acid, olefin complexes of platinum, alkenylsiloxane complexes of platinum, and carbonyl complexes of platinum; rhodium-based catalysts, such as tris(triphenylphosphine)rhodium; and iridium-based catalysts, such as bis(cyclooctadienyl)dichloroiridium. These catalysts may be in the form of solvates (e.g., hydrates, alcoholates, etc.). Further, the catalyst may be used in the form of a solution obtained by dissolving the catalyst in an alcohol (e.g., ethanol) when used. These catalysts can be used singly or in combination of two or more.

The amount of the catalyst used may be an effective amount as the catalyst. For example, the amount of the catalyst used is generally 0.00001 to 20 parts by mass, and preferably 0.0005 to 5 parts by mass, based on the total amount of 100 parts by mass of the compound represented the formula (5-ia), (5-iia), (5-iiia), or (5-iva), and the compound represented by the formula (6).

Although hydrosilylation proceeds without use of a solvent, the reaction can be carried out under milder conditions by using a solvent. Examples of solvents include aromatic hydrocarbon solvents, such as toluene and xylene; aliphatic hydrocarbon solvents, such as hexane and octane; ether solvents, such as tetrahydrofuran and dioxane; alcohol solvents, such as ethanol and isopropanol; and the like. These may be used singly or in combination of two or more.

The amount of the compound represented by the formula (6) is, for example, generally 0.5 to 2 mol, preferably 0.6 to 1.5 mol, and more preferably 0.8 to 1.2 mol, per mol of the Si—H group in the compound represented by the formula (5-ia), (5-iia), (5-iiia), or (5-iva).

The reaction temperature is generally 0° C. to 150° C., and preferably 10° C. to 120° C. The reaction time is generally about 1 hour to 24 hours.

After completion of the reaction, the solvent is distilled off from the reaction mixture, or a known isolation method is used, thereby obtaining an epoxy resin represented by the formula (1).

Examples of the organic fine particles used in the epoxy resin composition of the present invention include organic fine particles comprising resins, such as polyolefin resins, acrylic resins, silicone resins, butadiene rubber, polyester, polyurethane, polyvinyl butyral, polyarylate, polymethylmethacrylate, acrylic rubber, polystyrene, styrene-based copolymers (e.g., styrene-butadiene rubber), silicone-modified resins, acid-modified products of these resins, hydrogenated products of these resins, and the like.

These organic fine particles can be used singly or in combination of two or more of fine particles comprising one or two more materials. That is, one particle may comprise one or two more of these materials. Further, fine particles comprising different materials may be used singly or in combination of two or more.

Moreover, regarding the material (resin species) and structure of one particle, organic fine particles comprising a single resin, organic fine particles comprising two or more resins, and the like can be used. In the case of organic fine particles comprising two or more resins, for example, the particles may have a core-shell structure. Preferable examples of particles having a core-shell structure include particles configured such that one or two or more of the above materials are combined to form a core, and one or two or more materials different from the core material cover around the core. Specific examples include methyl methacrylate-butadiene-styrene type (MBS type) core-shell particles (which are obtained by graft polymerization of a butadiene-styrene copolymer (a core component) with methyl methacrylate etc. as a shell component). Commercial products can also be used as such core-shell particles.

Among these, polyolefin resins, polyester, polyurethane, polyvinyl butyral, styrene-based copolymers, and silicone-modified resins are preferable in terms of adhesion.

Moreover, polyolefin resins, acrylic resins, silicone resins, butadiene rubber, polyarylate, polymethylmethacrylate, acrylic rubber, polystyrene, styrene-based copolymers, and silicone-modified resins are preferable in terms of low dielectric characteristics.

These may be acid-modified and/or hydrogenated.

Preferable among these are organic fine particles comprising a polyolefin resin, a styrene-based copolymer, and a silicone-modified resin, as well as an acid-modified and/or hydrogenated product thereof, because they have both adhesion and low dielectric characteristics; and more preferable are organic fine particles comprising a polyolefin resin and a styrene-based copolymer, as well as an acid-modified and/or hydrogenated product thereof.

Examples of polyolefin resins include polyethylene, polypropylene, copolymerized polyolefin, modified polyolefin, and the like.

As the polyethylene, for example, low-density polyethylene and high-density polyethylene can be preferably used. The low-density polyethylene is preferably polyethylene with a density of 0.910 or more and less than 0.930 defined in old JIS K6748:1995. The high-density polyethylene is preferably polyethylene with a density of 0.942 or more defined in old JIS K6748:1995.

Preferable examples of polyolefin resins, such as copolymerized polyolefin and modified polyolefin, include copolymers of olefins and other monomers, acid-modified polyolefin, acid-modified copolymerized polyolefin, and the like. Preferable olefins are α-olefins and cyclic olefins. Specific examples include ethylene, propylene, 1-butene, 1-heptene, 1-octene, 4-methyl-1-pentene, tetracyclododecene, and the like. Of these, ethylene and propylene are preferable. Products obtained by polymerizing these olefins singly or in combination of two or more can also be preferably used as the polyolefin in the present invention.

Examples of other monomers copolymerized with olefins include ethylenically unsaturated monomers, such as (meth) acrylic acid-based carboxyl group-containing monomers and vinyl group-containing monomers; epoxy group-containing monomers, amino group-containing monomers, acid-modified group-containing monomers, monomers containing metal salts thereof, and the like.

Examples of ethylenically unsaturated monomers include acrylonitrile, vinyl acetate, acrylic acid, methacrylic acid, methyl (meth)acrylate, ethyl (meth)acrylate, propyl (meth) acrylate, butyl (meth)acrylate, 2-ethylhexyl (meth)acrylate, and the like.

Examples of epoxy group-containing monomers include glycidyl (meth)acrylate, glycidyl acetate, glycidyl butyrate, glycidyl hexoate, glycidyl benzoate, and the like.

Examples of amino group-containing monomers include dimethylaminoethyl (meth)acrylate, (meth)acrylamide, N,N-butoxymethyl (meth)acrylamide, N-methylacrylamide, and the like.

Examples of acid-modified group-containing monomers include maleic anhydride, maleate, and the like.

Moreover, these polyolefin resins also preferably include, for example, partially saponified ethylene-vinyl acetate copolymers, which are saponified ethylene-vinyl acetate copolymers; ethylene-vinyl alcohol copolymers, and the like.

Preferable among the polyolefin resins are polyethylene (e.g., low-density polyethylene and high-density polyethylene), polypropylene, a copolymer of ethylene or propylene and an epoxy group-containing monomer, a copolymer of ethylene or propylene and an acid-modified group-containing monomer, a copolymer of ethylene or propylene and an ethylenically unsaturated monomer, and a copolymer of ethylene or propylene and a tetracyclododecene; and more preferable are a copolymer of ethylene or propylene and an epoxy group-containing monomer, a copolymer of ethylene or propylene and an acid-modified group-containing monomer, and a copolymer of ethylene or propylene and an ethylenically unsaturated monomer. More specifically, preferable examples include an ethylene-glycidyl methacrylate copolymer, a propylene-glycidyl methacrylate copolymer, an ethylene-maleic anhydride copolymer, a propylene-maleic anhydride copolymer, an ethylene-acrylic acid copolymer, a propylene-acrylic acid copolymer, an ethylene-acrylic acid ester-maleic anhydride ternary copolymer, a propylene-acrylic acid ester-maleic anhydride ternary copolymer, a saponified ethylene-vinyl acetate copolymer, a saponified propylene-vinyl acetate copolymer, and the like.

Moreover, acid-modified polyolefin can also be preferably used as the polyolefin resin. More specifically, acid-modified polyethylene, acid-modified polypropylene, acid-modified copolymerized polyolefin, etc., can be preferably used.

The acid-modified polyolefin is preferably polyolefin or copolymerized polyolefin, whose acid-modified group, such as a carboxyl group or an acid anhydride group, is grafted. Examples of the polyolefin or copolymerized polyolefin include polyethylene, polypropylene, propylene-α-olefin copolymers, and the like. Propylene-α-olefin copolyers are obtained by copolymerization of propylene and other α-olefins. Further, the propylene-α-olefin copolymer may be copolymerized with other monomers.

Particularly preferable examples of the acid-modified polyolefin include maleic anhydride-modified polyethylene and maleic anhydride-modified polypropylene.

As the method for producing the acid-modified polyolefin, a known method can be used. For example, the acid-modified polyolefin can be produced by radical graft reaction of polyolefin or copolymerized polyolefin. More specifically, a radical species is generated in a polymer serving as a main chain, and unsaturated carboxylic acid and/or unsaturated carboxylic anhydride are graft-polymerized using the radical species as a polymerization starting point.

Examples of the unsaturated carboxylic acid and/or unsaturated carboxylic anhydride include unsaturated monocarboxylic acids, such as acrylic acid, butanoic acid, crotonic acid, vinylacetic acid, methacrylic acid, pentenoic acid, dodecenoic acid, linoleic acid, angelic acid, and cinnamic acid; unsaturated dicarboxylic acids, such as maleic acid, fumaric acid, chloromaleic acid, and himic acid; unsaturated carboxylic anhydrides, such as maleic anhydride, himic anhydride, and acrylic anhydride; and the like.

Preferable radical generators are organic peroxides and azo compounds. Specific examples include peroxides, such as di-tert-butylperoxy phthalate, tert-butylhydroperoxide, dicumyl peroxide, benzoyl peroxide, tert-butylperoxy benzoate, tert-butylperoxy-2-ethylhexanoate, tert-butylperoxy pivalate, methyl ethyl ketone peroxide, di-tert-butyl peroxide, and lauroyl peroxide; azo compounds, such as azobisisobutyronitrile, azobisisopropionitrile, and dimethyl 2,2'-azobisisobutyrate; and the like.

Moreover, examples of styrene-based copolymers include a styrene-butadiene copolymer, a styrene-ethylene propylene copolymer, a styrene-butadiene-styrene copolymer, a styrene-isoprene-styrene copolymer, a styrene-ethylene butylene-styrene copolymer, a styrene-ethylene propylene-styrene copolymer, and the like.

The organic fine particles contained in the epoxy resin composition of the present invention preferably have a volume average particle diameter of 50 μm or less, more preferably 0.05 to 50 μm, even more preferably 0.1 to 40 μm, and still more preferably 0.2 to 30 μm.

The shape of the organic fine particles contained in the epoxy resin composition of the present invention is preferably spherical. The spherical shape mentioned herein is such that the ratio of the longest diameter to the shortest diameter of the organic fine particles (longest diameter/shortest diameter) is 0.98 to 1.02.

The volume average particle diameter of the organic fine particles is a value determined by an electrical detection band method (pore electric resistance method). For example, the volume average particle diameter can be determined using an electric detection type particle size distribution measuring device (Coulter Multisizer, produced by Beckman Coulter).

Examples of the method for producing the organic fine particles used in the present invention include a method for mechanically grinding an organic resin using a high-shear pulverizing device; a method for obtaining particles by dissolving an organic resin in a good solvent, optionally adding a poor solvent, and depositing particles by cooling or evaporating the solvent to obtain particles; a method for obtaining organic resin particles dispersed by mixing the organic resin with a dispersing agent and water; and the like. Preferable among these is the method for obtaining organic resin particles dispersed by mixing the organic resin with a dispersing agent and water. According to this method, spherical particles can be preferably obtained. A surfactant can be used as the dispersing agent mentioned herein. For example, an ethylene oxide-propylene oxide copolymer etc. can be preferably used.

The amount of the organic fine particles is preferably 1 to 70 mass %, more preferably 10 to 65 mass %, even more preferably 20 to 60 mass %, and particularly preferably 25 to 55 mass %, based on the total mass of the epoxy resin composition (including the organic fine particles).

Moreover, the epoxy resin composition according to the present invention contains the organic fine particles in an amount of preferably 20 to 400 parts by mass, more preferably 30 to 300 parts by mass, and even more preferably 40 to 200 parts by mass, based on 100 parts by mass of the epoxy resin represented by the formula (1).

The epoxy resin composition of the present invention may contain an epoxy resin other than the epoxy resin represented by the formula (1). Examples of other epoxy resins include bisphenol A epoxy resins, bisphenol F epoxy resins, phenol novolak epoxy resins, cresol novolak epoxy resins, cycloaliphatic epoxy resins, brominated epoxy resins, triglycidyl isocyanurate, hydrogenated bisphenol A epoxy resins, aliphatic epoxy resins, glycidyl ether epoxy resins, bisphenol S epoxy resins, biphenyl epoxy resins, dicyclo epoxy resins, naphthalene epoxy resins, and the like. These epoxy resins may be used singly or in combination of two or more.

When an epoxy resin other than the epoxy resin represented by the formula (1) is mixed, the mixing ratio thereof may be within a range in which the effects of the present invention can be exhibited. When an epoxy resin other than the epoxy resin represented by the formula (1) is mixed, the mixing ratio of the epoxy resin represented by the formula (1) to the epoxy resin other than the epoxy resin represented by the formula (1) is, by mass ratio, for example, 100:0 to 20:80, preferably 100:0 to 30:70, and more preferably 100:0 to 40:60.

The epoxy resin composition of the present invention may contain a curing agent. The curing agent is not particularly limited, as long as it can react with the epoxy resin to produce a cured product.

Examples of curing agents include amine-based curing agents, amide-based curing agents, acid anhydride-based curing agents, phenol-based curing agents, mercaptan-based curing agents, isocyanate-based curing agents, active ester-based curing agents, cyanate ester-based curing agents, and the like.

Examples of amine-based curing agents include chain aliphatic amines, such as ethylenediamine, diethylenetriamine, triethylenetetramine, and tetraethylenepentamine; alicyclic amines, such as isophoronediamine, benzenediamine, bis(4-aminocyclohexyl)methane, bis(aminomethyl)cyclohexane, and diaminodicyclohexylmethane; aromatic amines, such as metaphenylenediamine, diaminodiphenylmethane, diethyltoluenediamine, and diaminodiethyldiphenylmethane; secondary and tertiary amines, such as benzyldimethylamine, triethylenediamine, piperidine, 2-(dimethylaminomethyl)phenol, 2,4,6-tris(dimethylaminomethyl)phenol, DBU (1,8-diazabicyclo(5,4,0)-undecene-7), DBN (1,5-diazabicyclo(4,3,0)-nonene-5), and the like.

Examples of amide-based curing agents include dicyandiamide and derivatives thereof, polyamide resins (e.g., polyaminoamide), and the like.

Examples of acid anhydride-based curing agents include aliphatic acid anhydrides, such as maleic anhydride and dodecenylsuccinic anhydride; aromatic acid anhydrides, such as phthalic anhydride, trimellitic anhydride, and pyromellitic dianhydride; alicyclic acid anhydrides, such as methylnadic anhydride, tetrahydrophthalic anhydride, methyltetrahydrophthalic anhydride, hexahydrophthalic anhydride, and 4-methylhexahydrophthalic anhydride; and the like.

Examples of phenol-based curing agents include phenol novolak resins, cresol novolak resins, biphenyl-type novolak resins, triphenylmethane-type phenol resins, naphthol novolak resins, phenol biphenylene resins, phenol aralkyl resins, biphenylaralkyl phenol resins, modified polyphenylene ether resins, compounds having a benzoxazine ring, and the like.

Examples of mercaptan-based curing agents include triethylolpropane tris(3-mercaptopropionate), tris-[(3-mercaptopropionyloxy)-ethyl]-isocyanurate, pentaerythritol tetrakis(3-mercaptopropionate), tetraethyleneglycol bis(3-mercaptopropionate), pentaerythritol tetrakis(3-mercaptobutyrate), 1,4-bis(3-mercaptobutyryloxy)butane, triethylolpropane tris(3-mercaptobutyrate), trimethylolethane tris(3-mercaptobutyrate), polysulfide polymers, and the like.

Examples of isocyanate-based curing agents include hexamethylene diisocyanate, 1,4-tetramethylene diisocyanate, 2-methylpentane-1,5-diisocyanate, lysine diisocyanate, isophorone diisocyanate, norbornane diisocyanate, and the like.

Examples of active ester-based curing agents include compounds having, per molecule, one or more ester groups reactive with epoxy resins. Specific examples include phenol esters, thiophenol esters, N-hydroxyamine esters, heterocyclic ring hydroxy compound esters, and the like.

The curing agents may be used singly, or in combination of two or more because they can be properly used corresponding to the required characteristics.

The mixing amount of the curing agent is not particularly limited. For example, the curing agent is preferably mixed so that the equivalent of reactive functional groups in the curing agent per equivalent of epoxy groups in the entire epoxy resin is 0.1 to 5. The equivalent is more preferably 0.3 to 3, and even more preferably 0.5 to 2.

The epoxy resin composition of the present invention may contain a curing accelerator. In particular, when used in combination with a curing agent, the curing accelerator can increase the curing reaction rate or enhance the strength of the cured product to be obtained. The curing accelerator is not particularly limited, as long as it can react with the epoxy resin to produce a cured product.

Examples of the curing accelerator include imidazole compounds, such as imidazole, 2-methylimidazole, 2-ethylimidazole, 2-ethyl-4-methylimidazole, and 2-phenylimidazole; dicyandiamide and derivatives thereof; tertiary amines, such as DBU (1,8-diazabicyclo(5,4,0)-undecene-7), DBN (1,5-diazabicyclo(4,3,0)-nonene-5), and 2,4,6-tris(dimethylaminomethyl)phenol; phosphorus-based compounds, Lewis acid compounds, cationic polymerization initiators, and the like.

Among these, in terms of heat resistance and electrical characteristics, the curing agent is preferably an acid anhydride-based curing agent, a phenol-based curing agent, an active ester-based curing agent, or a cyanate ester-based curing agent; and the curing accelerator is preferably an imidazole compound, a phosphorus-based compound, a Lewis acid compound, or a cationic polymerization initiator.

The curing accelerators may be used singly, or in combination of two or more because they can be properly used corresponding to the required characteristics.

The mixing amount of the curing accelerator is not particularly limited. For example, the curing accelerator is preferably mixed in an amount of 0.01 to 10 parts by mass, based on 100 parts by mass of the entire epoxy resin. The amount of the curing accelerator is more preferably 0.1 to 5 parts by mass, and even more preferably 0.5 to 3 parts by mass, The epoxy resin composition of the present invention may contain, if necessary, additives, within a range that does not impair the objects and effects of the present invention.

Examples of additives include antioxidants, inorganic fluorescent substances, lubricants, ultraviolet absorbers, heat light stabilizers, antistatic agents, polymerization inhibitors, antifoaming agents, solvents, anti-aging agents, radical inhibitors, adhesion-improving agents, flame retardants, surfactants, storage stability-improving agents, ozone aging inhibitors, thickeners, plasticizers, radiation-blocking agents, nucleating agents, coupling agents, conductivity-imparting agents, phosphorus-based peroxide-decomposing agents, pigments, metal deactivators, physical property-controlling agents, and the like.

The epoxy resin composition of the present invention can be produced by mixing the epoxy resin represented by the formula (1) and organic fine particles, and further optionally other components. The mixing method is not particularly limited, as long as it allows uniform mixing. Examples include mixing and stirring by paddle blades, mixing and stirring by a homomixer, mixing and stirring by a rotation-revolution mixer, and the like. The epoxy resin composition of the present invention has a low viscosity and thus can be prepared without the need to add a solvent; however, the epoxy resin composition of the present invention may contain, if necessary, a solvent (e.g., toluene, xylene, methyl ethyl ketone, acetone, cyclohexanone, methylcyclohexane, or cyclohexane) within a range that does not adversely affect the effects of the present invention.

A cured product can be obtained by curing the epoxy resin composition of the present invention. As the curing method, for example, the composition can be cured by heating. The curing temperature is generally room temperature to 250° C. The curing time varies depending on the composition liquid, and can be generally widely set from 30 minutes to 1 week.

In the present specification, the term "comprising" includes "consisting essentially of" and "consisting of."

EXAMPLES

The present invention is described in more detail below; however, the present invention is not limited to the following examples.

Production Example 1 (Production of Epoxy Resin A)

Allyl glycidyl ether (5.9 g), 0.05 g of 2 wt ethanol solution of hexachloroplatinic acid hexahydrate, and 100 g of toluene were placed in a 200-mL four-necked flask equipped with a stirrer, a thermometer, and a condenser in a nitrogen atmosphere, and the liquid temperature was raised to 70° C. Thereafter, 5.0 g of 1,4-bis(dimethylsilyl)benzene was added dropwise for 15 minutes, and the mixture was then stirred at 90° C. for 4 hours. After the toluene was removed by concentration, 10.3 g (epoxy equivalent: 211 g/eq) of 1,4-bis[(2,3-epoxypropyloxypropyl)dimethylsilyl]benzene (epoxy resin A) was obtained as a colorless, transparent liquid.

Production Example 2 (Production of Epoxy Resin B)

1,2-Epoxy-5-hexene (5.0 g), 0.05 g of 2 wt % ethanol solution of hexachloroplatinic acid hexahydrate, and 100 g of toluene were placed in a 200-mL four-necked flask equipped with a stirrer, a thermometer, and a condenser in a nitrogen atmosphere, and the liquid temperature was raised to 70° C. Thereafter, 5.0 g of 1,4-bis(dimethylsilyl)benzene was added dropwise for 15 minutes, and the mixture was then stirred at 90° C. for 5 hours. After the toluene was removed by concentration, 9.5 g (epoxy equivalent: 195 g/eq) of 1,4-bis[(2,3-epoxybutyl)dimethylsilyl]benzene (epoxy resin B) was obtained as a colorless, transparent liquid.

Production Example 3 (Production of Epoxy Resin C)

1,2-Epoxy-4-vinylcyclohexane (6.4 g), 0.05 g of 2 wt % ethanol solution of hexachloroplatinic acid hexahydrate, and 100 g of toluene were placed in a 200-mL four-necked flask equipped with a stirrer, a thermometer, and a condenser in a nitrogen atmosphere, and the liquid temperature was raised to 70° C. Thereafter, 5.0 g of 1,4-bis(dimethylsilyl)benzene was added dropwise for 15 minutes, and the mixture was then stirred at 90° C. for 4 hours. After the toluene was removed by concentration, 10.8 g (epoxy equivalent: 221 g/eq) of 1,4-bis{[2-(3,4-epoxycyclohexyl)ethyl]dimethylsilyl}benzene (epoxy resin C) was obtained as a colorless, transparent liquid.

Production Example 4 (Production of Epoxy Resin D)

1,2-Epoxy-4-vinylcyclohexane (4.3 g), 0.05 g of 2 wt % ethanol solution of hexachloroplatinic acid hexahydrate, and 250 g of toluene were placed in a 200-mL four-necked flask equipped with a stirrer, a thermometer, and a condenser in a nitrogen atmosphere, and the liquid temperature was raised to 70° C. Thereafter, 5.0 g of bis[(p-dimethylsilyl)phenyl] ether was added dropwise for 15 minutes, and the mixture was then stirred at 90° C. for 6 hours. After the toluene was removed by concentration, 8.9 g (epoxy equivalent: 267 g/eq) of 4,4'-bis{[2-(3,4-epoxycyclohexyl)ethyl]dimethylsilyl}diphenyl ether (epoxy resin D) was obtained as a colorless, transparent liquid.

Production Example 5 (Production of Epoxy Resin E)

1,2-Epoxy-4-vinylcyclohexane (7.4 g), 0.05 g of 2 wt % ethanol solution of hexachloroplatinic acid hexahydrate, and 250 g of toluene were placed in a 200-mL four-necked flask equipped with a stirrer, a thermometer, and a condenser in a nitrogen atmosphere, and the liquid temperature was raised to 70° C. Thereafter, 5.0 g of 1,3,5-tris(dimethylsilyl)benzene was added dropwise for 15 minutes, and the mixture was then stirred at 90° C. for 6 hours. After the toluene was removed by concentration, 11.8 g (epoxy equivalent: 208 g/eq) of 1,3,5-tris{[2-(3,4-epoxycyclohexyl)ethyl]dimethylsilyl}benzene (epoxy resin E) was obtained as a colorless, transparent liquid.

Examples and Comparative Examples

Components in amounts shown in Tables 1 and 2 were each weighed in a cup, and mixed at room temperature (25° C.) at 2000 rpm for 5 minutes using a rotation-revolution mixer (ARE-310, produced by Thinky Corporation). Thereafter, defoaming was performed at room temperature (25° C.) at 2200 rpm for 5 minutes, thereby preparing epoxy resin compositions. The epoxy resin compositions contained the used organic fine particles as they were.

The components in Tables 1 and 2 are as follows. The numerical value of each component in Tables 1 and 2 represents part by mass.

Epoxy resin F: cycloaliphatic epoxy resin, produced by Daicel Corporation (Celloxide 2021P; general name: 3',4'-epoxycyclohexylmethyl 3,4-epoxycyclohexanecarboxylate) (epoxy equivalent: 137 g/eq)

Epoxy resin G: Bis-A epoxy resin (Grade 828), produced by Mitsubishi Chemical Corporation (epoxy equivalent: 189 g/eq)

Organic fine particles A: Spherical organic fine particles (produced by Sumitomo Seika Chemicals Co., Ltd.) obtained by making the volume average particle diameter of ethylene-glycidyl methacrylate copolymer fine particles "Bond First" (produced by Sumitomo Chemical Co., Ltd.) to 13 μm Organic fine particles B: Spherical organic fine particles (produced by Sumitomo Seika Chemicals Co., Ltd.) obtained by making the volume average particle diameter of maleic anhydride-modified polyethylene "Admer" (produced by Mitsui Chemicals, Inc.) to 25 μm Organic fine particles C: maleic anhydride-modified polypropylene "ACumist 1863" (produced by Honeywell, Inc., volume average particle diameter: 6 to 7.5 μm)

Other component A: 4-methylhexahydrophthalic anhydride/hexahydrophthalic anhydride=70/30 (MH-700, produced by New Japan Chemical Co., Ltd.)

Other component B: 2-ethyl-4-methylimidazole (produced by Mitsubishi Chemical Corp.)

The volume average particle diameter of each of the organic fine particles is a value measured by an electric detection type particle size distribution measuring device (Coulter Multisizer, produced by Beckman Coulter). Specifically, 20 ml of ISOTON II (electrolyte, produced by Beckman Coulter) and 0.2 ml of anionic surfactant, such as sodium alkylsulfate, were mixed in a 100-ml beaker. Then, 0.1 g of the respective organic fine particles were added thereto, and the particles were dispersed by applying ultrasonic waves for 3 minutes while stirring with a spatula. The volume average particle diameter was measured using the resulting dispersions by an electric detection type particle size distribution measuring device (Coulter Multisizer, produced by Beckman Coulter).

The obtained epoxy resin compositions of the Examples and Comparative Examples were evaluated for the following items. Tables 1 and 2 also show the results of each evaluation.

(1) 90-Degree Peel Strength Against Copper Foil

The epoxy resin compositions obtained in the Examples and Comparative Examples were each applied to an aluminum plate, and a 35-μm-thick electrolytic copper foil (produced by Furukawa Electric Co., Ltd.) was superimposed thereon. The resulting products were cured by heating at 100° C. for 1 hour, 120° C. for 2 hours, and 150° C. for 2 hours. After curing, cuts with a width of 1 cm were made with a cutter, thereby preparing 90-degree peel strength test pieces. The obtained test pieces were each subjected to a 90-degree peel strength test using AGS-X (produced by Shimadzu Corp.) at a test rate of 50 mm/min. Tables 1 and 2 show the results.

(2) Electric Characteristics (Relative Dielectric Constant and Dielectric Loss Tangent)

The epoxy resin compositions obtained in the Examples and Comparative Examples were each poured into a resin mold (thickness: 2 mm), and cured by heating at 100° C. for 1 hour, 120° C. for 2 hours, and 150° C. for 2 hours. Subsequently, the cured products were each cut into size of 20 mm width×30 mm length×2 mm thickness. Thus, test pieces for dielectric measurement were obtained. The relative dielectric constant (1 GHz) and the dielectric loss tangent (1 GHz) of each of the obtained test pieces were measured using a dielectric constant measuring device (Impedance Analyzer, produced by Agilent) at 25° C. The dielectric constant measuring device was calibrated with PTFE. Tables 1 and 2 show the results.

TABLE 1

|  | Example 1 | Example 2 | Example 3 | Example 4 | Example 5 | Example 6 | Example 7 | Example 8 | Example 9 | Example 10 | Example 11 |
|---|---|---|---|---|---|---|---|---|---|---|---|
| Epoxy resin A | 100 | | | | | | | | | | |
| Epoxy resin B | | 100 | | | | | | | | | |
| Epoxy resin C | | | 100 | 100 | 100 | 100 | 100 | 100 | 100 | | |
| Epoxy resin D | | | | | | | | | | 100 | |
| Epoxy resin E | | | | | | | | | | | 100 |
| Organic fine particles A | | | 72 | | | | | | | | |
| Organic fine particles B | | | | | | | | 72 | 168 | 70 | 100 |
| Organic fine particles C | 74 | 76 | | 74 | 103 | 72 | 111 | | | | |
| Other component A | 71 | 76 | 67 | 54 | 48 | 67 | 67 | 67 | 67 | 56 | 72 |
| Other component B | 1 | 1 | 1 | 1 | 1 | 1 | 1 | 1 | 1 | 1 | 1 |
| 90-degree peel strength (N/cm) | 9.2 | 9.0 | 8.5 | 9.4 | 8.0 | 8.5 | 6.3 | 9.1 | 10.2 | 9.0 | 8.7 |
| Relative dielectric constant (1 GHz) | 2.6 | 2.5 | 2.5 | 2.5 | 2.3 | 2.5 | 2.4 | 2.5 | 2.4 | 2.5 | 2.5 |
| Dielectric loss tangent (1 GHz) | 0.005 | 0.003 | 0.003 | 0.003 | 0.003 | 0.004 | 0.003 | 0.004 | 0.003 | 0.003 | 0.003 |

TABLE 2

| | Comparative Example 1 | Comparative Example 2 | Comparative Example 3 | Comparative Example 4 | Comparative Example 5 |
|---|---|---|---|---|---|
| Epoxy resin F | 100 | 100 | 100 | 100 | |
| Epoxy resin G | | | | | 100 |
| Organic fine particles A | | | 90 | | |
| Organic fine particles B | | | | 90 | |
| Organic fine particles C | 12 | 121 | | | 77 |
| Other component A | 119 | 91 | 110 | 110 | 79 |
| Other component B | 1 | 1 | 1 | 1 | 1 |
| 90-degree peel strength (N/cm) | 6.2 | 6.5 | 7.7 | 8.5 | 6.5 |
| Relative dielectric constant (1 GHz) | 2.8 | 3.3 | 2.6 | 2.7 | 2.7 |
| Dielectric loss tangent (1 GHz) | 0.015 | 0.011 | 0.013 | 0.012 | 0.011 |

The invention claimed is:

1. An epoxy resin composition comprising an epoxy resin, an acid anhydride-based curing agent, a curing accelerator, and organic fine particles, the organic fine particles being polyolefin resin fine particles, and the epoxy resin being at least one epoxy resin selected from the group consisting of:

epoxy resin being represented by the formula (1-iia):

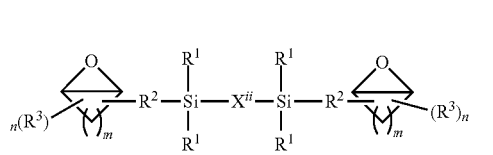

(1-iia)

wherein $X^{ii}$ is a divalent group obtained by removing two hydrogen atoms from a saturated hydrocarbon ring or an unsaturated hydrocarbon ring, or from rings having a structure in which 2 to 6 saturated hydrocarbon rings and/or unsaturated hydrocarbon rings are condensed; or a divalent group represented by the formula ($2^g$-iia);

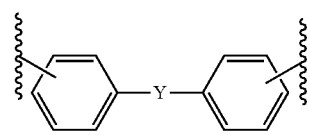

($2^g$-iia)

Y is a bond, a $C_{1-6}$ alkylene group that may be substituted with a $C_{1-4}$ alkyl group, an oxygen atom (—O—), a sulfur atom (—S—), —SO—, or —SO$_2$—;

each $R^1$ is the same or different, and is a $C_{1-18}$ alkyl group, a $C_{2-9}$ alkenyl group, a cycloalkyl group, an aryl group, or an aralkyl group, wherein one or more carbon atoms of these groups may be replaced by at least one atom selected from the group consisting of an oxygen atom and a nitrogen atom;

each $R^2$ is the same or different, and is a $C_{1-18}$ alkylene group, wherein one or more carbon atoms of this group other than a carbon atom directly bonded to a silicon atom may be replaced by at least one atom selected from the group consisting of an oxygen atom and a nitrogen atom;

$R^3$ is the same or different, and is a $C_{1-18}$ alkyl group, a $C_{2-9}$ alkenyl group, a cycloalkyl group, an aryl group, or an aralkyl group, wherein one or more carbon atoms of these groups may be replaced by at least one atom selected from the group consisting of an oxygen atom and a nitrogen atom;

m is an integer of 0 to 6; and n is an integer of 0 to 3; and an epoxy resin represented by the formula (1-iiia):

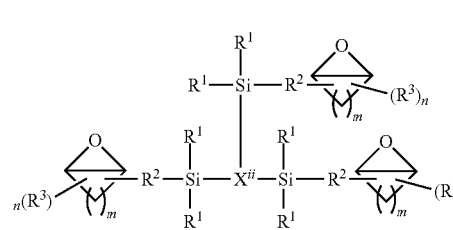

(1-iiia)

wherein $X^{iii}$ is a trivalent group obtained by removing three hydrogen atoms from a saturated hydrocarbon ring or an unsaturated hydrocarbon ring, or from rings having a structure in which 2 to 6 saturated hydrocarbon rings and/or unsaturated hydrocarbon rings are condensed;

or a trivalent group represented by the formula ($2^g$-iiia):

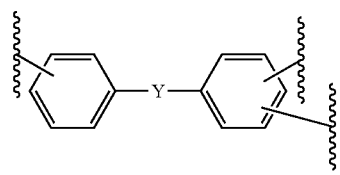

($2^g$-iiia)

wherein Y is as defined above; and $R^1$, $R^2$, $R^3$, m, and n are as defined above, wherein the organic fine particles are contained in an amount of 70 to 168 parts by mass based on 100 parts by mass of the epoxy resin, and the organic fine particles are selected from the group consisting of:

an ethylene-glycidyl methacrylate copolymer, maleic anhydride-modified polyethylene and maleic anhydride-modified polypropylene.

2. The epoxy resin composition according to claim 1, wherein the at least one epoxy resin is selected from the group consisting of:

an epoxy resin represented by the formula (1-IIa):

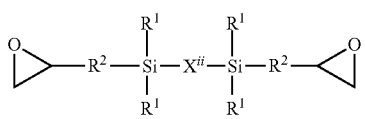

(1-IIa)

wherein $R^1$, $R^2$, and $X^{ii}$ are as defined above, an epoxy resin represented by the formula (1-IIb):

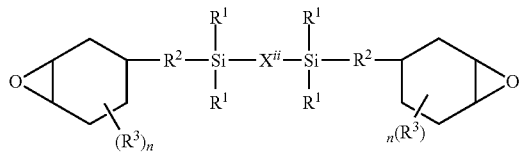

(1-IIb)

wherein $R^1$, $R^2$, $R^3$, $X^{ii}$, and n are as defined above, and an epoxy resin represented by the formula (1-IIIa):

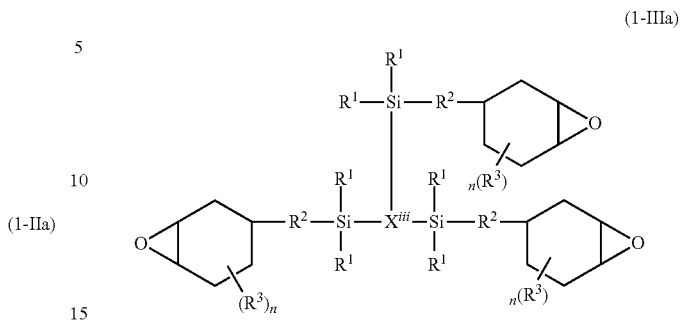

(1-IIIa)

wherein $R^1$, $R^2$, $R^3$, $X^{iii}$, and n are as defined above.

3. The epoxy resin composition according to claim 1, wherein the organic fine particles have a volume average particle diameter of 50 μm or less.

4. The epoxy resin composition according to claim 1, wherein the organic fine particles have a spherical shape.

5. A cured product of the epoxy resin composition according to claim 1.

6. A semiconductor sealing material, a liquid sealing material, a potting material, a sealing material, an interlayer insulation film, an adhesive layer, a coverlay film, an electromagnetic shielding film, a printed circuit board material, or a composite material, each of which comprises the epoxy resin composition according to claim 1.

7. A semiconductor sealing material, a liquid sealing material, a potting material, a sealing material, an interlayer insulation film, an adhesive layer, a coverlay film, an electromagnetic shielding film, a printed circuit board material, or a composite material, each of which comprises the cured product according to claim 5.

* * * * *